(12) United States Patent
Bell

(10) Patent No.: US 7,433,744 B2
(45) Date of Patent: Oct. 7, 2008

(54) METHOD AND APPARATUS FOR SPATIALLY COORDINATING, STORING AND MANIPULATING COMPUTER AIDED DESIGN DRAWINGS

(76) Inventor: Robert A Bell, 3218 O St., NW., Washington, DC (US) 20007

( * ) Notice: Subject to any disclaimer, the term of this patent is extended or adjusted under 35 U.S.C. 154(b) by 210 days.

(21) Appl. No.: 10/519,020

(22) PCT Filed: Jun. 21, 2002

(86) PCT No.: PCT/US02/19991

§ 371 (c)(1),
(2), (4) Date: Dec. 8, 2005

(87) PCT Pub. No.: WO03/001391

PCT Pub. Date: Jan. 3, 2003

(65) Prior Publication Data

US 2006/0100722 A1   May 11, 2006

Related U.S. Application Data

(60) Provisional application No. 60/339,707, filed on Dec. 12, 2001, provisional application No. 60/299,808, filed on Jun. 21, 2001.

(51) Int. Cl.
*G06F 17/50* (2006.01)
(52) U.S. Cl. ............................................. 700/59; 703/1
(58) Field of Classification Search ........................ None
See application file for complete search history.

(56) References Cited

U.S. PATENT DOCUMENTS 4,937,768 A    6/1990   Carver et al. ............ 364/571.01

(Continued)

OTHER PUBLICATIONS

A machine vision system for the recognition and positioning of two-dimensional partially occluded objects Abou-El-Ela, M.; El-Amroussy, F.; Electrotechnical Conference, 1996. MELECON '96., 8th Mediterranean vol. 2, May 13-16, 1996 pp. 1087-1092 vol. 2 Digital Object Identifier 10. 1109/MELCON.1996.551397.*

(Continued)

*Primary Examiner*—Michael B Holmes
(74) *Attorney, Agent, or Firm*—Woodcock Washburn LLP

(57) ABSTRACT

A technique and associated software for spatially coordinating, storing, and manipulating computer aided Design (CAD) files with a master dimensional plan (MDP) file (FIG. 1, MPD File, Plan, Electrical, Structural, etc.). The plan, elevation, section, and other related files are coordinated to a single unified spatial layout referenced to the MDP file. Special "tools" are used to design, manipulate and present the information as two-dimensional drawings referenced in the working space to the MDF file. Moving between the CAD drawing files coordinated to the MDP is facilitated by using icons corresponding to standard architectural graphic symbols as switch file icons that switch the user to other view files of the displayed object based on the selected graphic symbol. The technique allows the user who is familiar with standard architectural nomenclature to move through CAD drawing files without needing to know the underlying CAD file structure. The iconic switching technique of the invention may also be used to move among coordinated no-architectural design drawings of industrial items and the like and may also be used independent of the spatial coordinating method as desired.

6 Claims, 31 Drawing Sheets

U.S. PATENT DOCUMENTS

| | | | | |
|---|---|---|---|---|
| 4,945,488 | A | | 7/1990 | Carver et al. ............ 364/474.24 |
| 4,956,764 | A | | 9/1990 | Carver et al. ............ 364/167.01 |
| 5,023,800 | A | | 6/1991 | Carver et al. ............ 364/474.24 |
| 5,033,014 | A | | 7/1991 | Carver et al. ............ 364/571.01 |
| 5,106,290 | A | | 4/1992 | Carver et al. ................ 425/470 |
| 5,255,211 | A | * | 10/1993 | Redmond ..................... 703/6 |
| 5,597,520 | A | | 1/1997 | Smalley et al. .............. 264/401 |
| 5,808,690 | A | * | 9/1998 | Rich .......................... 345/505 |
| 5,847,971 | A | * | 12/1998 | Ladner et al. .................. 703/1 |
| 5,923,338 | A | * | 7/1999 | Rich .......................... 345/505 |
| 5,999,184 | A | * | 12/1999 | Smalley et al. .............. 345/419 |
| 6,002,855 | A | * | 12/1999 | Ladner et al. .................. 703/1 |
| 6,104,842 | A | * | 8/2000 | Rich .......................... 382/304 |
| 6,366,825 | B1 | * | 4/2002 | Smalley et al. .............. 700/120 |
| 6,413,084 | B1 | * | 7/2002 | Rubbert et al. ................ 433/29 |
| 6,532,299 | B1 | * | 3/2003 | Sachdeva et al. ............ 382/128 |
| 7,068,836 | B1 | * | 6/2006 | Rubbert et al. .............. 382/154 |
| 7,265,826 | B2 | * | 9/2007 | Mottin ....................... 356/319 |
| 7,305,367 | B1 | * | 12/2007 | Hollis et al. ................ 705/400 |

OTHER PUBLICATIONS

Watermarking of two-dimensional engineering graph based on the orthogonal complete U-system Cai Zhanchuan; Sun Wei; Xiong Changzhen; Qi Dongxu; Computer Aided Design and Computer Graphics, 2005. Ninth International Conference on Dec. 7-10, 2005 p. 5 pp. Digital Object Identifier 10.1109/CAD-CG.2005.87.*

Work in progress—development of tools to improve the spatial ability of engineering students Towle, E.; Mann, J.; Kinsey, B.; Frontiers in Education, 2005. FIE '05. Proceedings 35th Annual Conference Oct. 19-22, 2005 pp. F3D—1-2 Digital Object Identifier 10.1109/FIE.2005.1612080.*

Two-dimensional IC layout compaction based on topological design rule checking Valainis, J.; Kaptanoglu, S.; Liu, E.; Suaya, R.; Computer-Aided Design of Integrated Circuits and Systems, IEEE Transactions on vol. 9, Issue 3, Mar. 1990 pp. 260-275 Digital Object Identifier 10.1109/43.46802.*

* cited by examiner

FIGURE 5
FIGURE 6
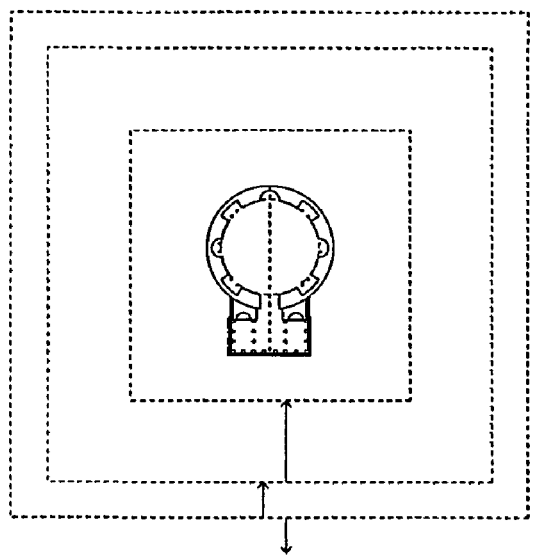
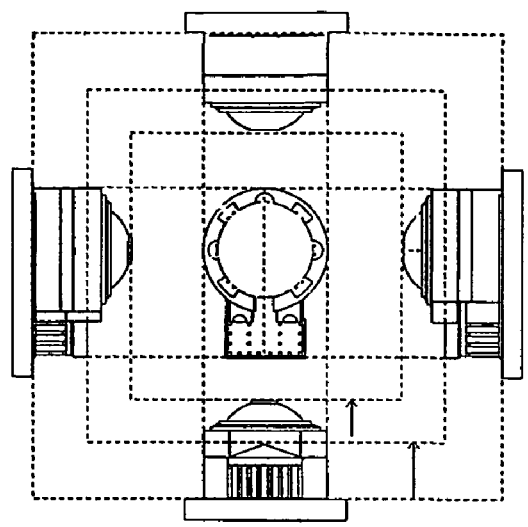

METHOD AND APPARATUS FOR SPATIALLY COORDINATING, STORING AND MANIPULATING COMPUTER AIDED DESIGN DRAWINGS

CROSS-REFERENCE TO RELATED APPLICATIONS

This application is the National Stage of International Application No. PCT/US02/19991, filed Jun. 21, 2002, which claims the benefit of U.S. Provisional Application No. 60/299,808, filed Jun. 21, 2001 and U.S. Provisional Application No. 60/339,707, filed Dec. 12, 2001, the disclosure of which is incorporated herein by reference in its entirety.

BACKGROUND OF THE INVENTION

1. Field of the Invention

The present invention relates to a method and apparatus for spatially coordinating Computer Aided Design (CAD) drawings for storage and manipulation and, more particularly, to a systematic, integrated and accurate method of spatially coordinating, storing and manipulating CAD drawings with a Master Dimensional Plan file. The method of the invention coordinates the location of plans, elevations, and sections in a single unified spatial layout referenced to a Master Dimensional Plan file (referred to herein as the "MDP" file) and uses specific "tools" to design, manipulate and present the information as two-dimensional drawings. Such tools include a method of moving between CAD drawing files using standard architectural graphic symbols as icons without using the file open dialog box, thus allowing the user to move through CAD drawing files without needing to know the underlying CAD file structure.

2. Description of the Prior Art

Computer Aided Design (CAD) drawings are vector diagrams of objects. These drawings exist in the computer program in "space" which is known in different CAD programs as "model space" for AutoCAD or "working space" for MicroStation, and the like. This application will use the term "working space" to refer to this space and will also use MicroStation terminology in describing the function and operation of the system. For purposes of this description, MicroStation SE version 5.7 with its user's guide conventions will be used. Alternative versions of MicroStation and other CAD programs, such as AutoCAD, would use the equivalent tools for implementing the method of the invention. The vector models are drawn in "full scale" in working space. When they are printed, they are reproduced in various scales for construction or design documents in order to fit on various sizes of media. These scaled reproductions are called "paper space" in AutoCAD.

A problem with existing CAD software systems, such as MicroStation and AutoCAD, is that there is no standard method for spatially locating CAD drawing files relative to each other in working space. This is particularly true of locating drawing files of the z-axis with respect to the plan files of the x-axis and y-axis. In other words, there is a need in the art for a way to consistently locate files with varying z-axis such as sections and elevations so that they have a specific spatial relationship to plan files.

Because conventional CAD drawing files are presented on the viewing screen or on printed documents in two dimensions, what is needed is a system to relate the files that are in the x-y axis with those that are in the z-axis. Although drawings may "appear" three-dimensional with systems such as renaissance perspective or axonometric drawings, drawings by their nature are two-dimensional.

Generally, drawing files can exist in the exact same x-y coordinates. Thus, for example, drawings such as a $1^{st}$ floor plan and the $1^{st}$ floor electrical plan can be located in the same coordinates in separate files. These same coordinates can contain innumerable drawing files that exist in the same spatial location. However, only a limited number can be viewed simultaneously in the same space on the display in an understandable fashion.

Presently, the U.S. National CAD Standards include a Uniform Drawing System from the Construction Specifications Institute (CSI), CAD Layer Guidelines from the American Institute of Architects (AIA), and Plotting Guidelines from the CAD Geographic Information Systems (GIS) Technical Center and U.S. Coast Guard However, none of these standards provides a method for locating drawing files systematically with respect to each other in working space.

While programs such as AutoCAD allow one to reference any particular point of a drawing back to a point where the X, Y and Z axes are all zero, programs such as AutoCAD do not provide a method for systematically relating all the drawing files of projects together spatially in working space.

The problem of where to locate drawing files spatially is crucial to accurately designing and manipulating the object represented in the drawing files. For example, in architectural drawings, if floor plan files are not aligned correctly with the structure files, errors or confusion may occur during construction. Further, if elevation files do not align with the plan files correctly, the openings containing windows may not be properly sized or coordinated with other systems. It is known in the CAD art that different drawing files can be located together. For example, elevation files are located on top of section files. However, this approach does not provide a systematic way to coordinate different types of drawing files such as a plan file with elevation files. A solution to this problem is needed.

The present inventor has further observed that moving between CAD files in conventional CAD systems is difficult because it requires the user to be intimately familiar with the file structure and organization. This is undesirable, particularly in the case of larger architectural projects where multiple persons access the drawings at different times. A methodology is further desired that makes moving around the architectural views of an object more intuitive. Preferably, such a method will allow for easy navigation amongst coordinated CAD views of an object.

The present invention organizes CAD drawings together into a unified system to address these and other shortcomings in the art.

SUMMARY OF THE INVENTION

The system and method of organizing CAD drawings in accordance with the invention is ideally used by engineers, architects, planners, and all businesses required to keep track of physical property and the physical design and description of three-dimensional objects. As used herein, physical property can include buildings, roads, utilities, bridges, transportation, landscape, hardscape, molecules, and the like. The invention also provides a systematic way to organize all CAD drawings for academic study, historical preservation and for the systematic presentation of buildings on Intranet and Internet sites. Having a systematic way to spatially organize architectural CAD drawings in accordance with the invention is equivalent to using the Dewey Decimal system for coordinating the location of books.

The above-identified limitations in the art are overcome by providing a spatial coordination system that uses existing CAD software functions to create an independent coordinating file known as the Master Dimensional Plan (MDP) File. Elevations, sections and details that are orthographically projected from coordinated plan files are mapped to the MDP File by using similar parallel shapes to coordinate points of elevations on all z axis drawings simultaneously. In addition, data such as centerlines, site or floor elevations are also located on the MDP file, thus allowing this information to exist in one and only one place in a set of drawings or a contract (architectural) document.

Software macros are also used to provide switching icons that provide an intuitive method for the user to move from one CAD file to another related CAD file in a CAD drawing system. The resulting method is similar to using icons in a window display versus using DOS language commands except that the icons of the invention describe the drawing view as opposed to the launch of a program function.

This iconic method of switching files in accordance with the invention is based on using already understood standard graphic architectural symbols such as section cut symbols, elevation symbols, floor level symbols, etc. These icons already are used to inform those knowledgeable in architecture where to look for more specific information about a project. With the use of these symbols as icons that function as macro switches in the CAD drawing program, the historical method of organization and understanding architectural information may be integrated with an electronic method of organizing CAD architectural drawing files in accordance with the invention to provide the technical effect of overcoming the afore-mentioned limitations in the prior art.

The present invention provides a spatially coordinated system of displaying all the CAD drawings of the various parts of an object. As will be explained in detail below, such a display consists of various CAD files such as plans, Master Coordinating files, sections, elevations, details, etc. Within this display, the method of the present invention includes placing "switch file icons" in the CAD image that will change the active file from one file to another. For example, a "switch file icon" appearing on the plan can be clicked onto to switch the user to another file. For example, if one is viewing the plan, by clicking onto the designated "switch file icon" indicated on the referenced elevation, the active file will be automatically switched to the referenced elevation. This iconic method replaces the "exchange tool" of the "Reference File" toolbox or the Open file toolbox in the conventional CAD drawing software sequence. This switch can take place without going through the process of opening the Reference file tool box, selecting the reference file, selecting the tool selection, and then finally selecting "exchange." Not only does the technique of the invention save time, but further, and perhaps much more important, the invention allows one to move through various CAD files without understanding or even knowing the nomenclature or directory structure of the files. This technique can eliminate one of the most time consuming, frustrating and difficult aspects of dealing with CAD drawings-understanding the CAD file designation.

Further, because the method of the invention is graphic and spatial, various existing file systems can be used without adjusting or changing the existing nomenclature of the file system. The importance of this in very large jobs, such as in the Pentagon redesign effort, cannot be overemphasized. The methodology of the invention allows any individual to come onto any job where the CAD coordinating method is used with the CAD locating method of the present invention and began working immediately without learning the filing system.

BRIEF DESCRIPTION OF THE DRAWINGS

The above-mentioned and other characteristic features and advantages of the invention will be apparent from the following detailed description in connection with the accompanying drawings of which:

FIG. 5 illustrates a top view of a base shape constructed on the MDP file.

FIG. 6 illustrates the orthographic projections referenced to the base shape of FIG. 5.

DETAILED DESCRIPTION OF THE PREFERRED EMBODIMENT

In the illustrative examples given herein, an architectural design is used as an example of the operation of the spatial coordination and iconic switching techniques of the invention. Of course, the techniques of the invention are not limited to particular types of architectural or object designs but may be used with all types of objects of varying shapes and sizes.

I. System Elements

Figure 1:
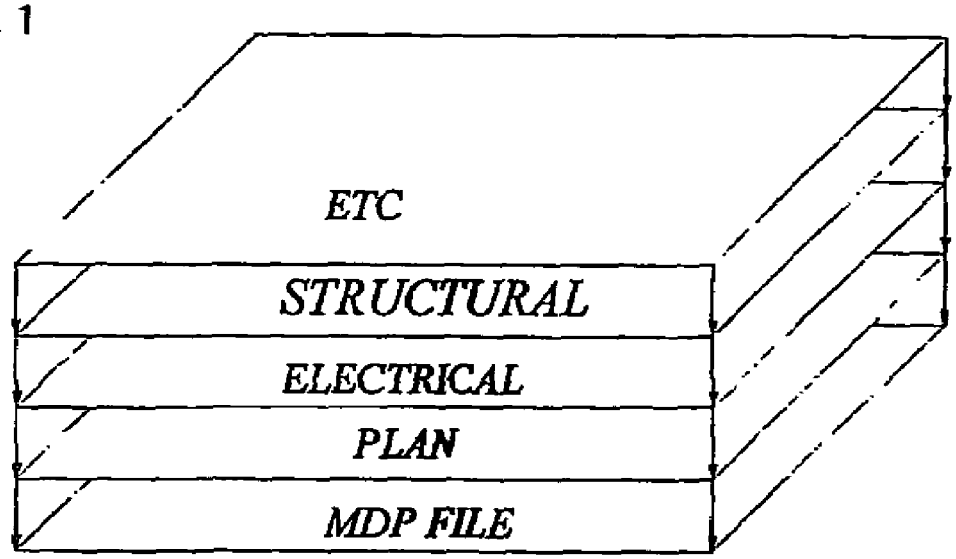
FIG. 1 illustrates the Master Dimensional Plan (MDP) file as a series of transparent sheets, or separate CAD files, which are overlaid on top of each other but where each layer of information is independent but congruent.

Conventional CAD software routines are used in accordance with the invention to create a Master Dimensional Plan (MDP) File that is a separate file upon which all the other files created by the CAD software to represent views of an object are coordinated spatially with each other. The MDP file is the file where organizing dimensions are held to coordinate the dimensions of all other CAD files. Generally speaking, the coordination of plan files "on top of each other" in the same x and y coordinates is universally used in the prior art to organize CAD drawings such that the site plan file has the foundation plan file placed upon it and foundation plan file has the $1^{st}$ floor plan file placed upon it, and the like. In two-dimensional drawings, all of these plans occur in the same coordinates in space. In accordance with the invention, however, these separate plans are laid over the MDP file whereby all of these files exist in the same three-dimensional coordinates in space. As illustrated in FIG. 1, this feature of the invention may be illustrated as a series of transparent sheets, or separate CAD files, which are overlaid on top of each other but where each layer of information is independent but congruent. Unlike existing CAD systems, the plan file, structural file, electrical file, and the like are coordinated in space to the MDP file. The significance of this will be explained in detail below.

Figure 2:
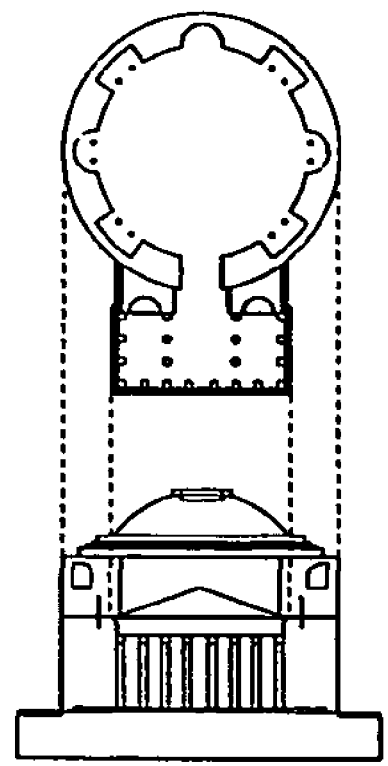
FIG. 2 illustrates the standard method for projecting elevations whereby the elevation is projected below the plan, with the top closest to the plan and the bottom furthest from the plan.

The orthographic projection of elevations from a plan is the standard method of drawing exterior elevations, sections, and the like (i.e., looking at the object from outside of the object). The reason for orthographic projection for elevations is to keep the horizontal elements of the drawing to scale and avoid distortion caused by perspective. The standard method for projecting elevations is to project the elevation below the plan, that is, with the top closest to the plan and the bottom furthest from the plan as shown in FIG. 2. In FIG. 2, it is noted that if one projects the top of the object down, that is, away from the plan, it will create a mirror image.

The number of sides of the object determines the number of orthographic projections. In a typical four-sided building, these elevations are typically represented as the east, west, north and south elevations. If the building were to have a triangular plan, then there would be three elevations. If the building were to have an octagonal plan, then there would be eight elevations, and so on for the number of sides the polygon might contain. This conventional method works whether the plan is a regular geometric figure or not, as shown in FIGS. 3 and 4.

Figure 3:
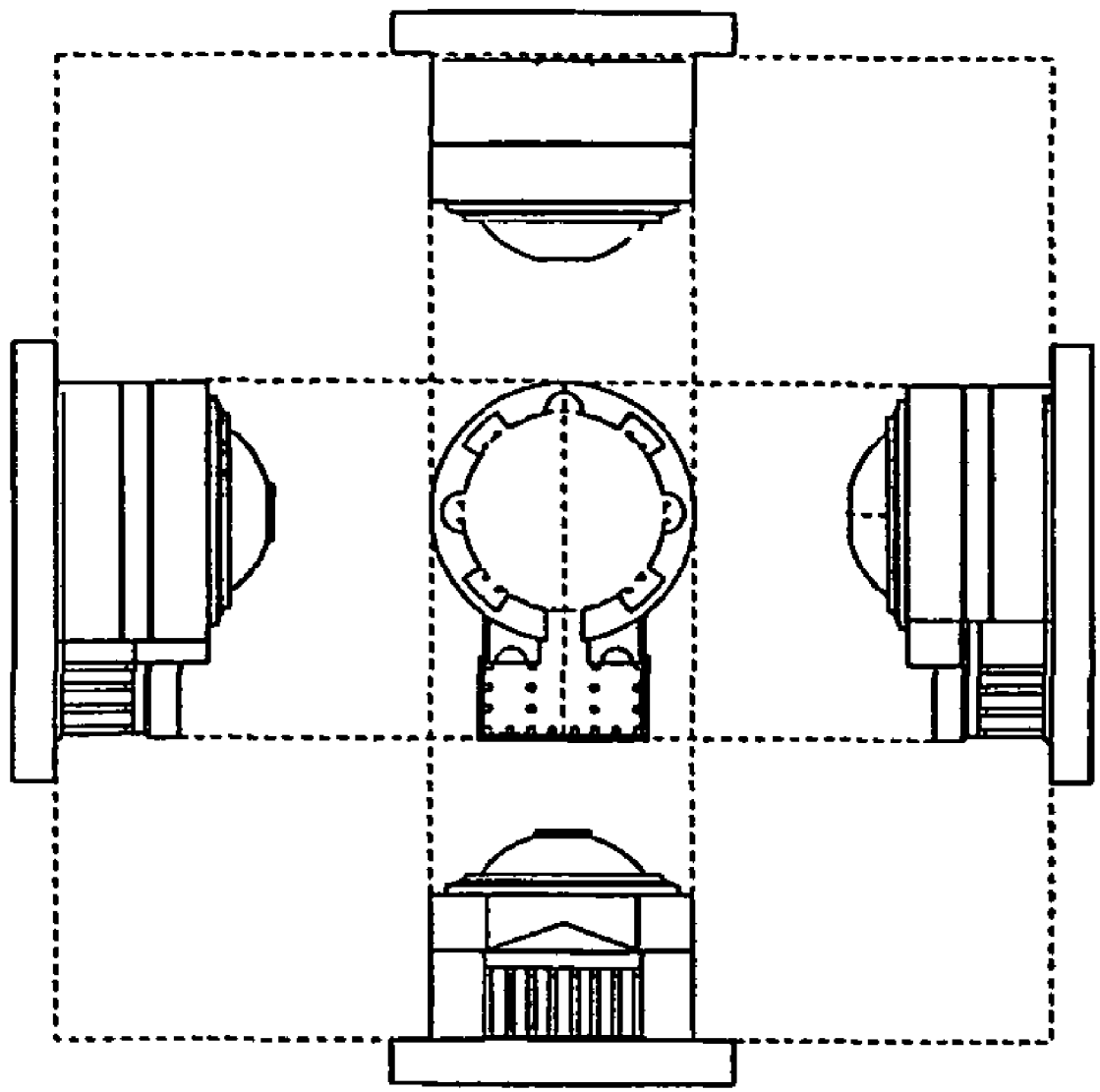
FIG. 3 illustrates an orthographic projection for a regular geometric figure.
Figure 4:
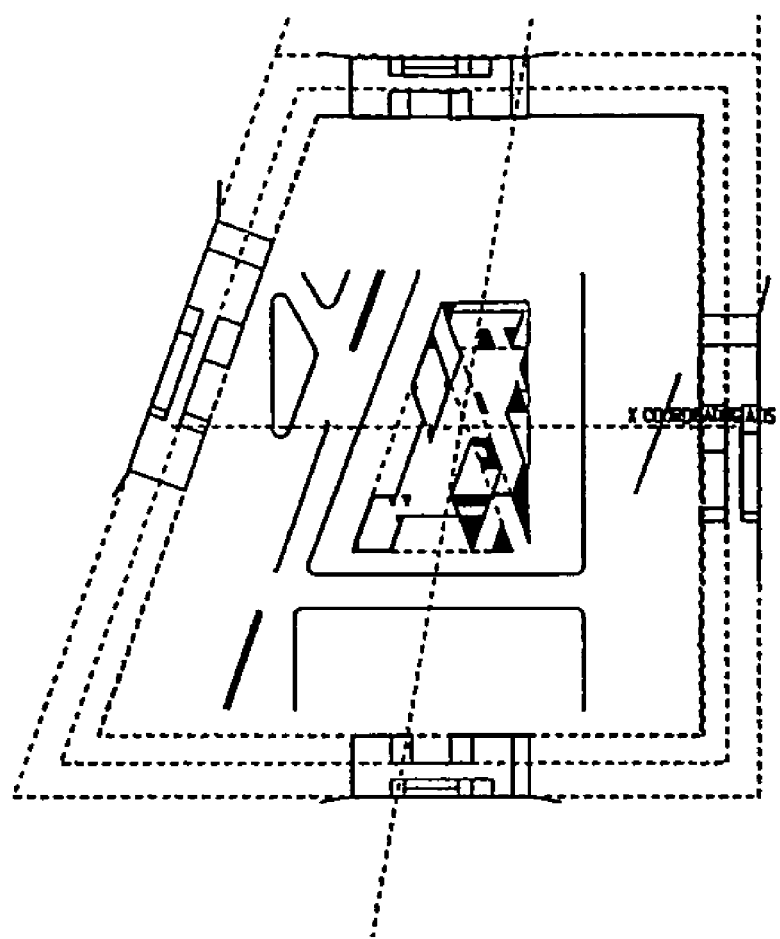
FIG. 4 illustrates an orthographic projection for an irregularly shaped figure.

The method of the invention builds upon the conventional approach of FIGS. 2-4 by using parallel closed shapes to coordinate points on the z-axis for all elevations, sections and details simultaneously. The location of the orthographic projections relative to the plan is established by creating a closed shape, where each edge of the closed shape is parallel to an edge of the plan and represents one orthogonal plane on the z-axis. Generally, these planes are an equal distance from the plan but this is not necessary for the method to work. As will be described below, relative elevations on the z-axis are determined by expanding similar parallel closed shapes, where each shape represents one and only one plane on the z-axis.

Typically, for the design of a building, the first closed shape (typically a polygon for most architecture) is constructed as the $1^{st}$ floor level or the ground level. Then, each orthographic projection is located with the "bottom" or elevation located on the "first floor" shape. As shown in FIGS. 5 and 6, the base shape is constructed on the MDP file and then the orthographic projections are referenced to that shape.

Figure 7:
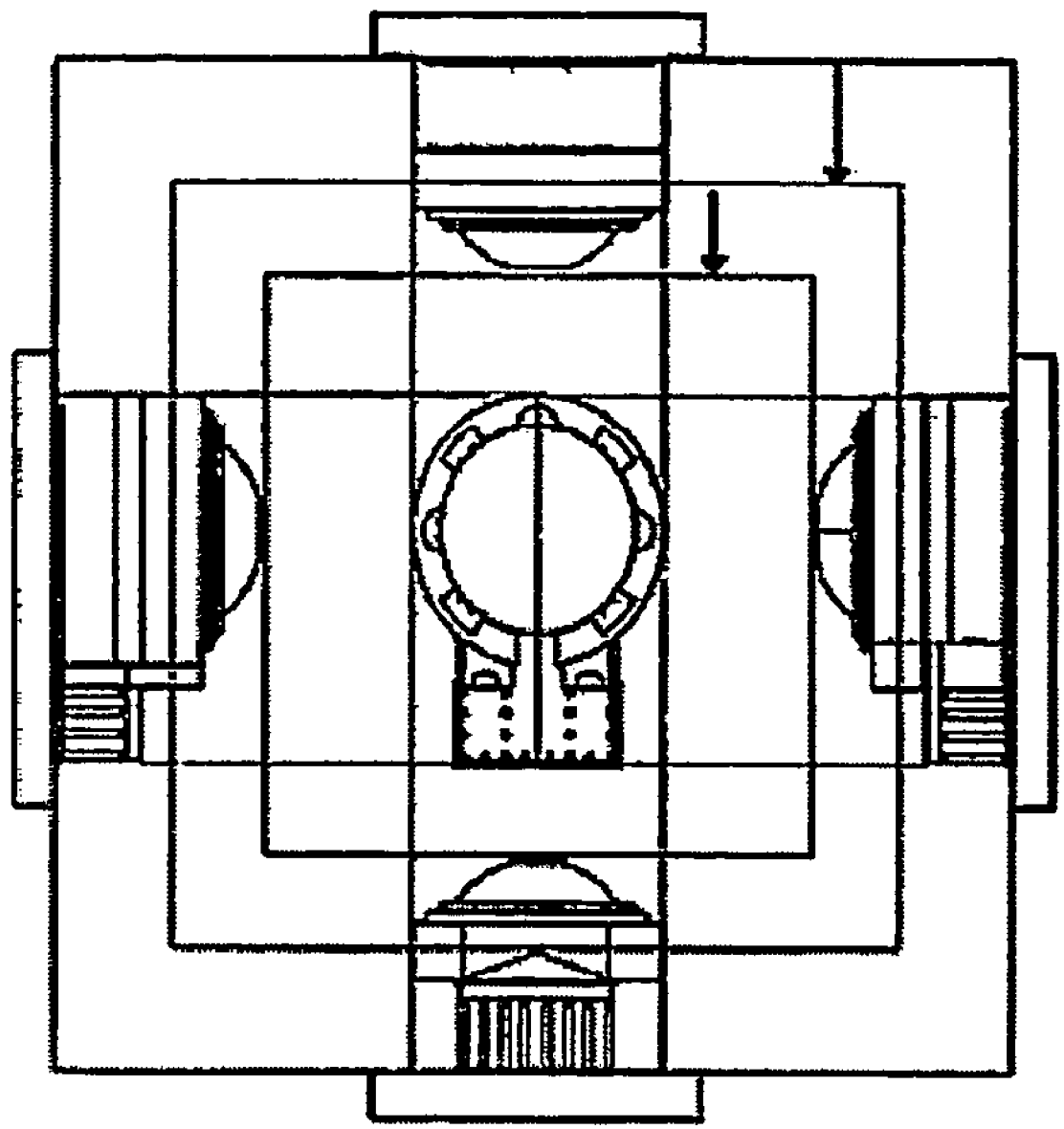
FIG. 7 illustrates how all the elevations, sections and details are spatially located in the same place in space relative to the MDP whereby the details of a building or the section cuts of the building are easily found and can be manipulated.

Data located on the MDP file allow control of the design by having items appear one and only one time in the architectural contract documents. One of the fundamental principles of all architectural contract documents is that a dimension should appear in one and only one place. By locating the basic shape in one and only one place, all the parts of the project can be coordinated to that base data. There are a series of additional data that can be located on the MDP file such as centerlines, axes, a single elevation scale, various control points such as top of floor, top of roof, etc. However, because this information is located on the MDP file and all the other documents are referenced back to it, this information occurs in one and only one place. In other words, all the elevations, sections and details are located in the same place in space relative to the plan. Thus, as is apparent from FIG. 7, the details of a building or the section cuts of the building are easily found and can be manipulated.

The method of the invention will now be described in connection with the creation of CAD files and organizing building designs using the command features of the well-known MicroStation CAD program. Those skilled in the art will appreciate that AutoCAD and other CAD programs also may be used to implement the same general organization principles in accordance with the invention. For this description, MicroStation SE version 5.7 with its user's guide conventions will be used. Alternative versions and other CAD programs, such as AutoCAD, would use the equivalent tools for implementing the method of the invention.

Figure 8:
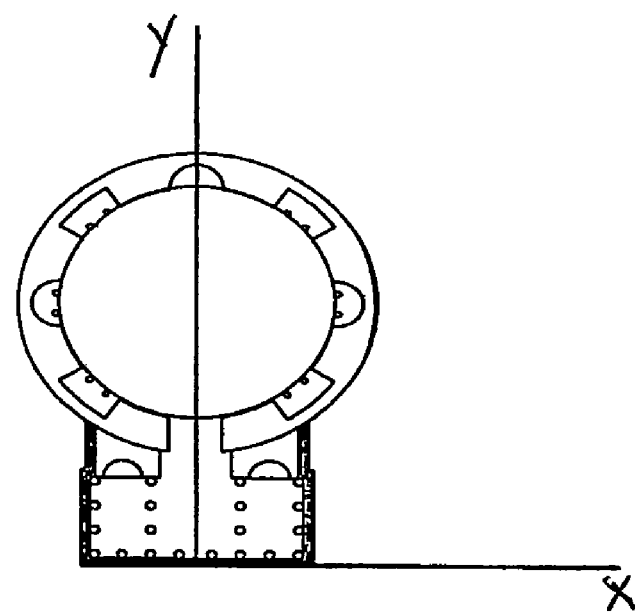
FIG. 8 illustrates typical architectural plans created with reference to a typical x-y axis.

The CAD drawing spatial coordinating method of the invention is implemented using MicroStation CAD software to effect the following steps:

1. Draw typical plans using the MicroStation software as shown in FIG. 8. Each plan should be drawn on a separate File that is referenced to each other file. For further coordination, plans should be referenced to $_{Files}$ for the survey of the site plan and these should ideally reference to the earth coordinates of longitude and latitude.

Figure 9:
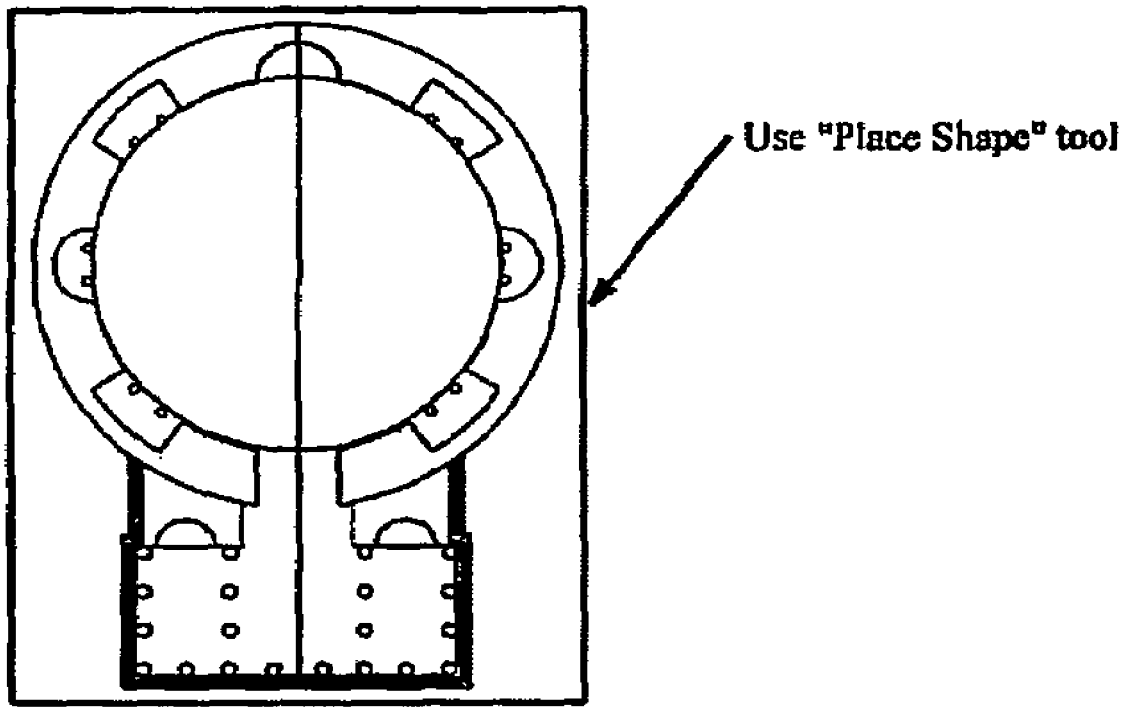
FIG. 9 illustrates a shape created on the MDP surrounding each of the sides of the plan to be drawn, where the shape is a square, rectangle, octagon, triangle, or polygon depending on the building for which it is being used.

2. On a separate file (sheet), which is referred to above as the MDP file, use the $_{Place\ Block}$ tool of MicroStation to create a $_{shape}$ on the MDP surrounding each of the sides of the plan to be drawn. As shown in FIG. 9, this shape might be a square, rectangle, octagon, triangle, or polygon depending on the building or object for which it is being used. One should use the appropriate $_{Place\ Block}$ tool to create the appropriate $_{shape}$.

Figure 10:
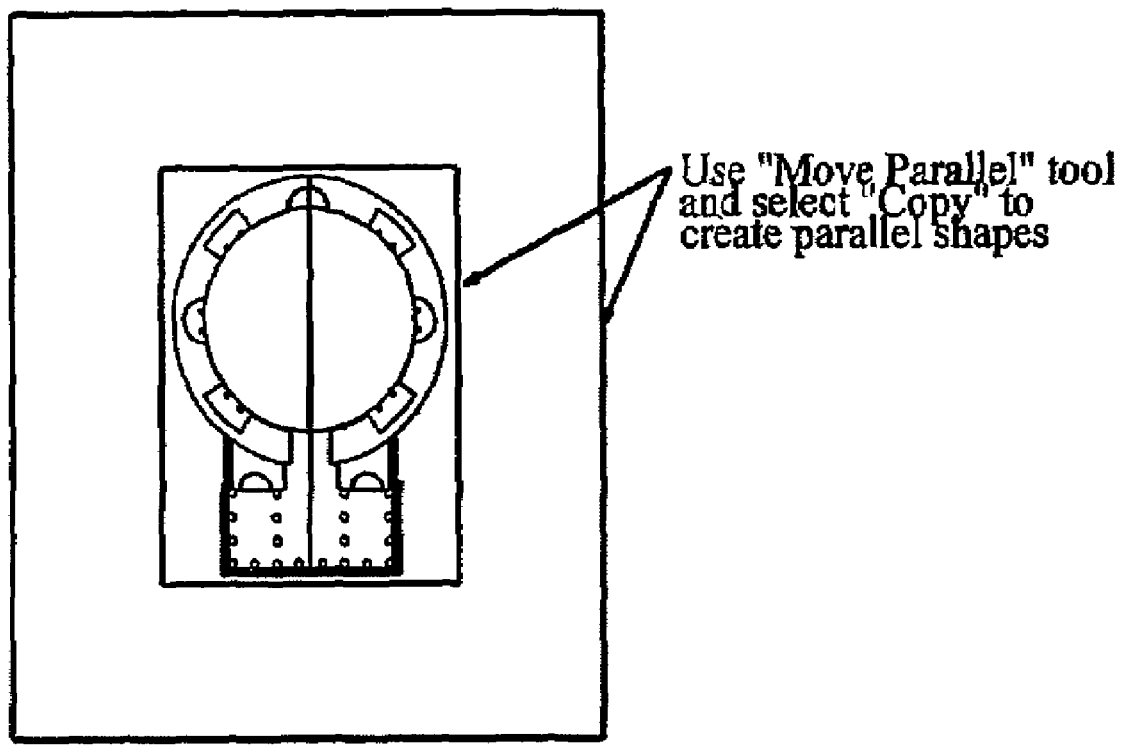
FIG. 10 illustrates shapes placed at various equal distances from the plan, such shapes representing a plane all the points at the various distances of the z-axis of the drawing.

3. Having created a shape, use the Move Parallel tool of MicroStation to create similar parallel shapes for the various z distances from the x y-axis plan. As shown in FIG. 10, an infinite number of Shapes at various equal distances from the plan may be created with the Move Parallel tool of MicroStation. These Shapes will represent all the points at the various distances of the z-axis of the drawing. In other words, these parallel shapes now represent the various elevations of the building. Every parallel Shape will represent the exact same elevation on every elevation, section and detail of the building to be drawn. These parallel "shapes" or polygons now represent the z coordinates for the design of the elevations, sections, and details of the building that exist in the z-axis.

Figure 11:
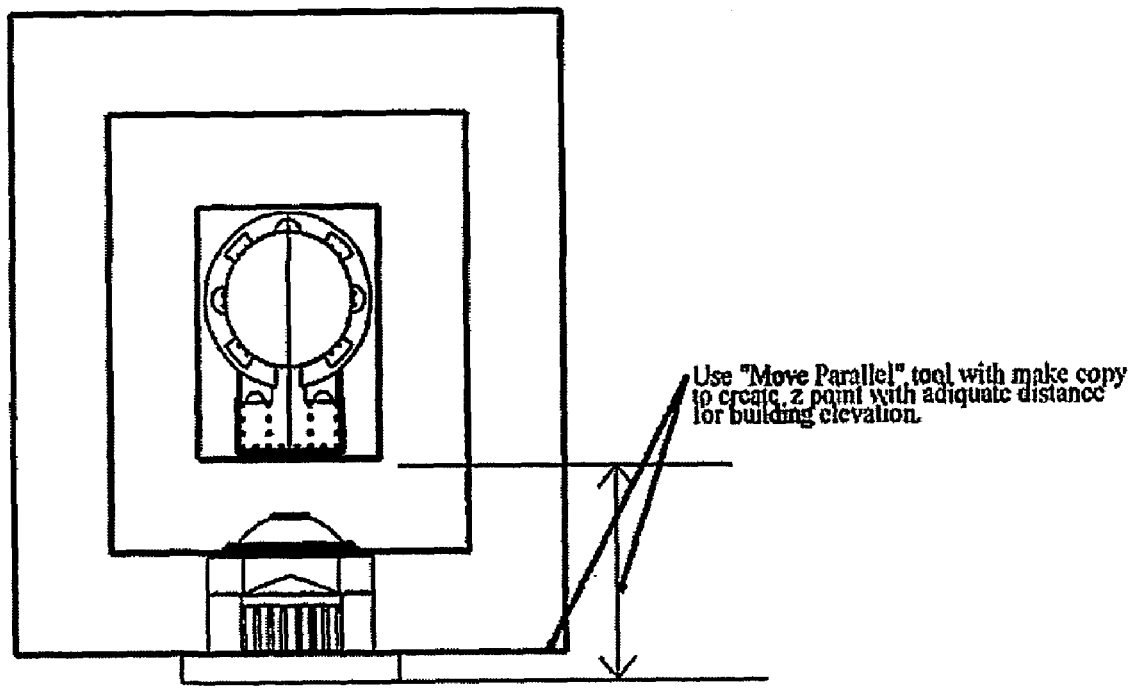
FIG. 11 illustrates a first floor or ground elevation of the building relative to the z-axis shapes on the MDP.

4. Using MicroStation, now open a new file (sheet), which might be the North Elevation "file" and with Attach Reference of MicroStation attach both the MDP File and the appropriate Plan File. Then construct the elevation of the building. Begin by creating a Shape with the Move Parallel tool of MicroStation as shown in FIG. 11, which is the first floor or ground elevation of the building. This Shape should be far enough away from the referenced Plan File so as not to overlap the Plan File and cause confusion during drawing of the elevations, sections, etc. When this Shape, or base elevation, has been determined, it should be copied to the MDP and designated by its specific elevation relative to sea level. This will act as the control line for the coordination of all the other elevations of the existing and designed elements in elevation using the techniques of the invention.

Figure 12:
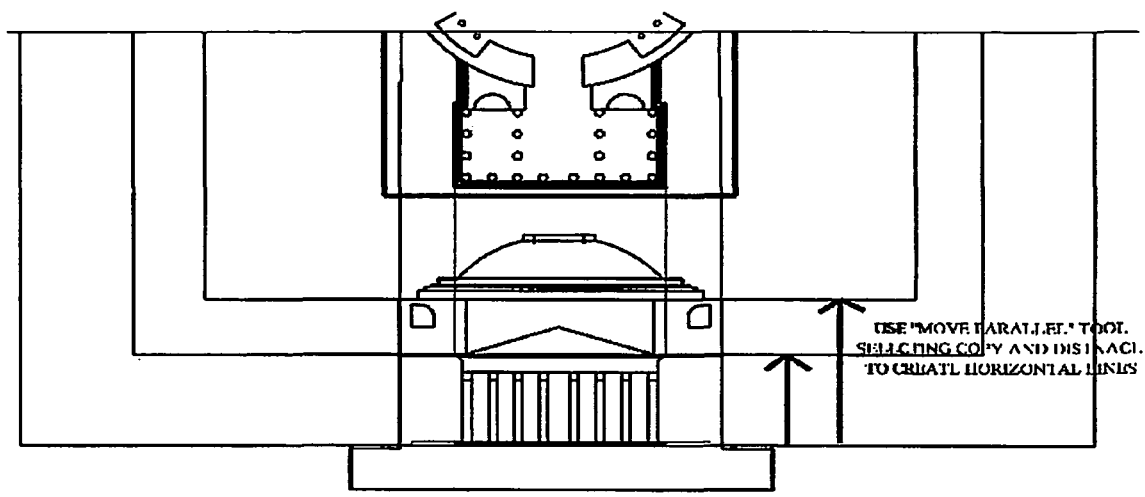
FIG. 12 illustrates the use of conventional CAD software commands to draw the ceiling at the correct distance with reference to the floor.

5. Note that when drawing the elevation on its own separate "file," one uses the Move Parallel command for copying the Shape at the desired distance. Thus, for example, if the first floor is 9 feet high, the Move Parallel command with Distance and Make Copy selected will draw the ceiling at the correct distance as shown in FIG. 12.

Figure 13:
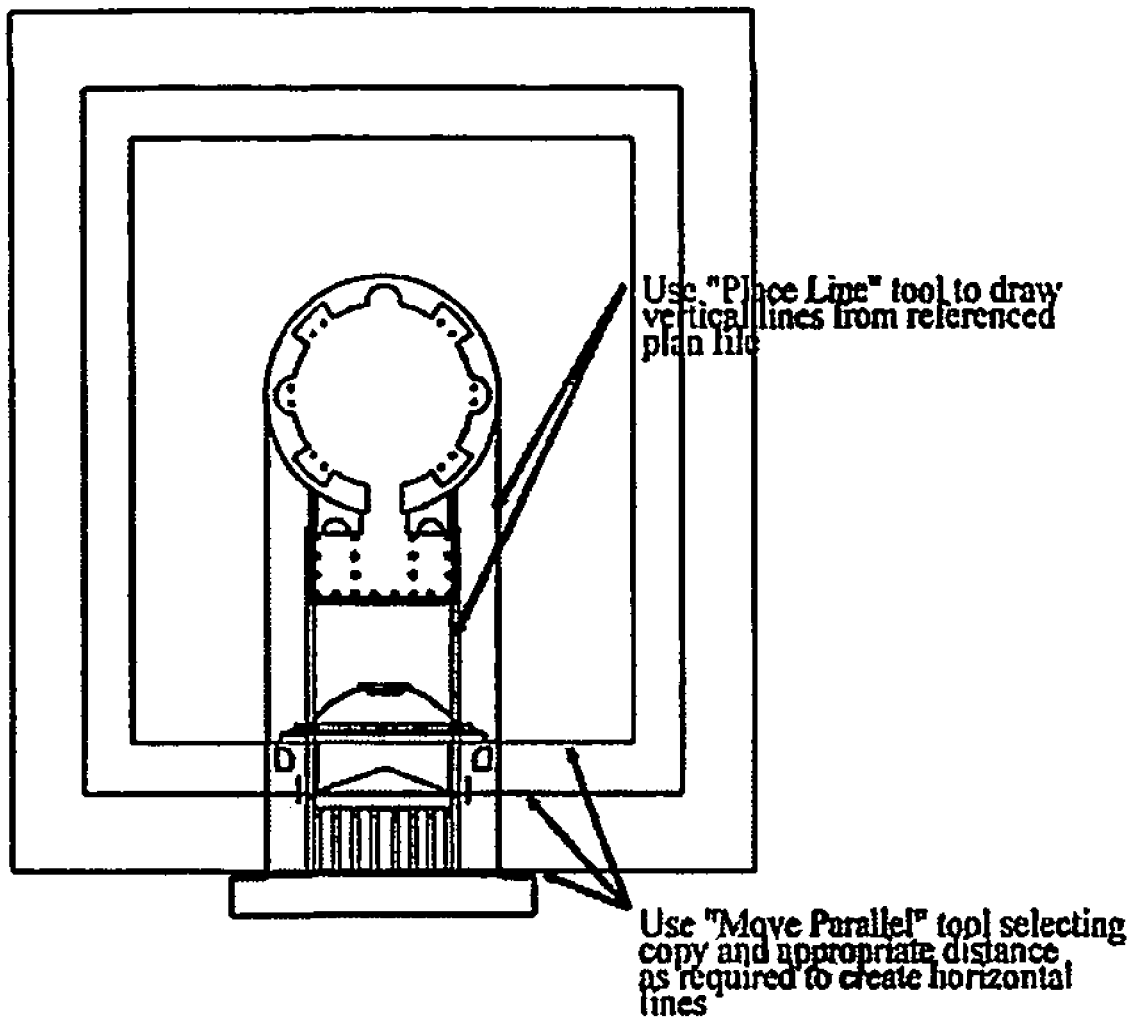
FIG. 13 illustrates the edges of the elevations created by using conventional CAD software commands to create horizontal lines and to draw lines at known distances in the elevations.

6. Once the base line Shape is determined on the MDP, return the Elevation File with the attached Plan File and MDP File. Using the Place Line tool of MicroStation, snap from the plan and extend down to the base Shape to create the edges of the elevations in accordance with the typical drafting method for drawing elevations. Using the Move Parallel tool of MicroStation, select Copy to create horizontal lines and select Distance to draw lines at known distances as shown in FIG. 13.

Figure 14:
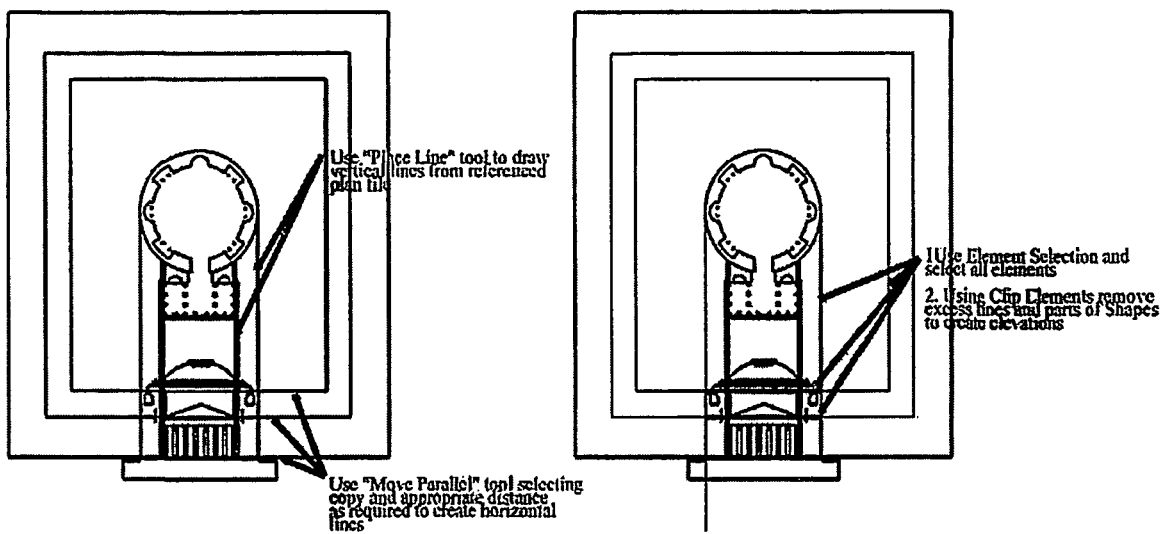
FIG. 14 illustrates the use of conventional CAD software commands to select all elements and to clip vertical lines and horizontal Shapes to create the desired elevation.

7. As shown in FIG. 14, by using the Select Element tool of MicroStation, select all elements and with the Trim Elements tool of MicroStation clip vertical lines and horizontal Shapes to create the elevation as required. All horizontal lines for the elevations, sections, and details are determined similarly. For example, if the thickness of the floor is 1'-2," that is established again by using the Move Parallel command with Distance and Make Copy selected.

Figure 15:
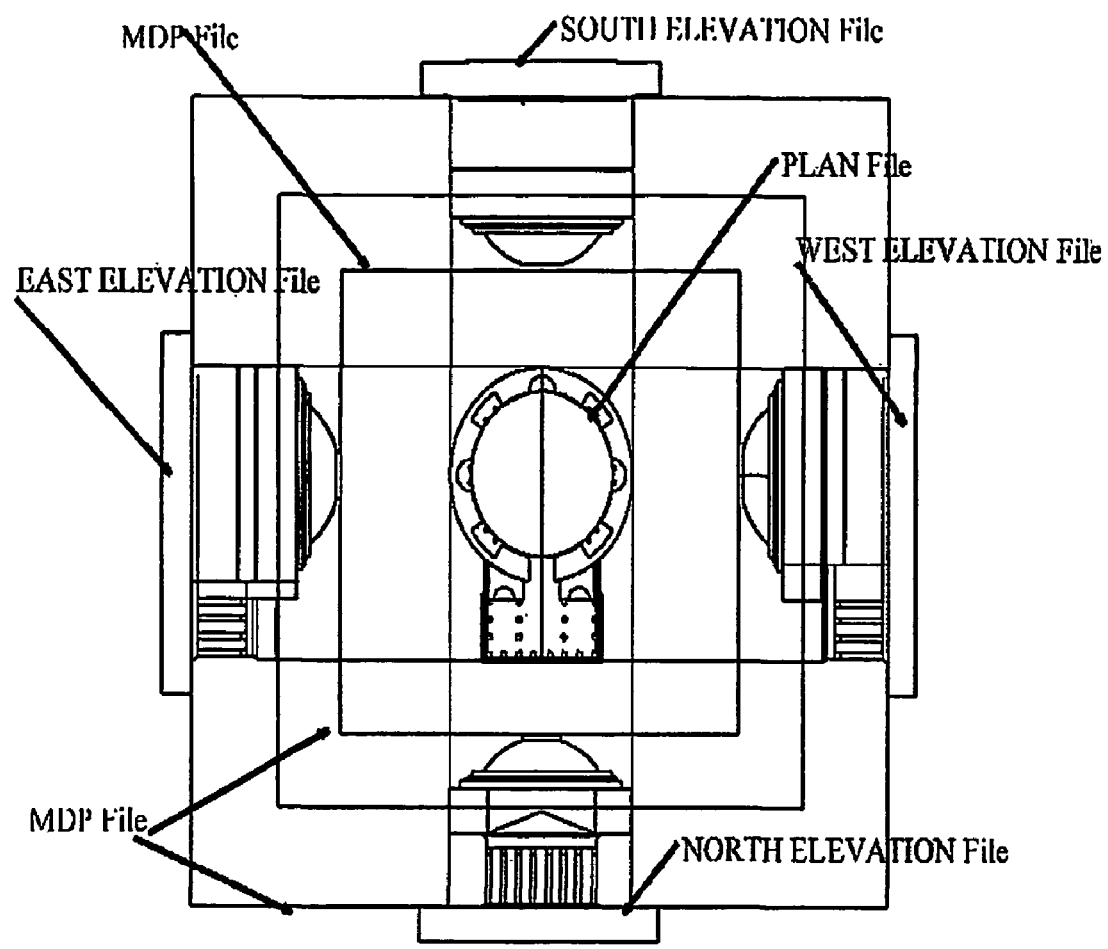
FIG. 15 illustrates the initial construction of the elevations where each elevation is copied to its own "file" for future work and development.

8. Each elevation is now constructed using the MicroStation CAD software as required. Although each elevation should be located on a separate file for future use and development, for ease of construction, they may all be initially constructed on one elevation "file." Once the initial construction of the elevations has been accomplished, each elevation should be copied to its own "file" for future work and development as shown in FIG. 15. The original file should have the extra elevation eliminated so that only one elevation is on each "file."

9. During the construction of the elevation files, one should return to the MDP and establish floor levels with their specific elevation attached. Dimensions such as floor to ceiling height or floor-to-floor height can be designated on the MDP. "Controlling" dimensions should be called out one and only one time and only on the MDP file. All other files should not contain z-axis dimensions. Thus, the fundamental rule of design is facilitated since there is one and only one place in the complete set of documents in which the dimensions and elevations are designated. All other files in the contract documents or working drawings should be referenced back to the MDP file—it and it alone controls all dimensions in the z-axis. A similar rule may be applied to the plan with the survey control points designated to control the location of all dimensions in the contract architectural document. These dimensions would also appear on a level on the MDP File.

Figure 16:
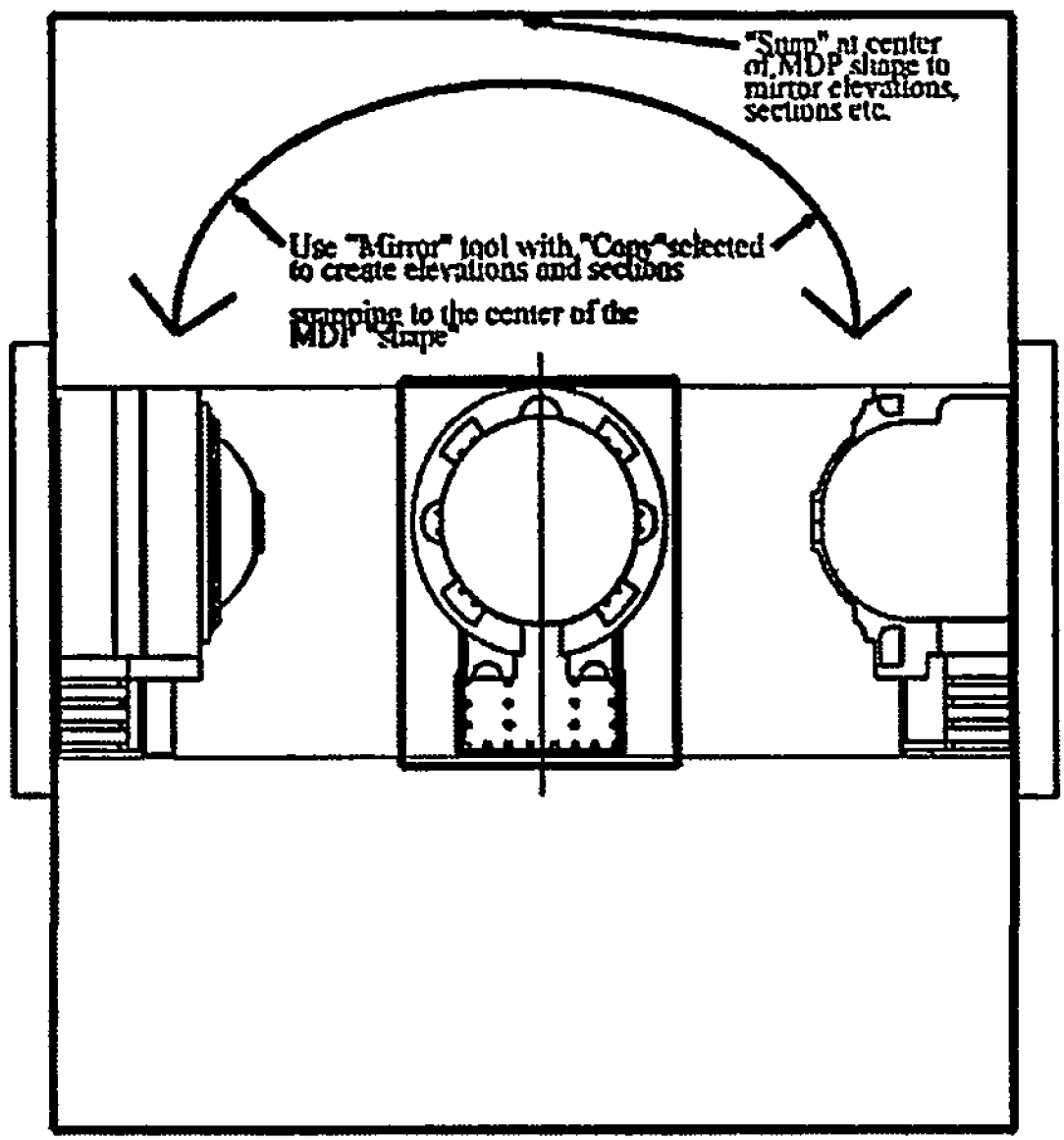
FIG. 16 illustrates that in drawing and designing various elevations, opposite sides of the building can be both designed by and checked against each other by using conventional Mirror tools and snapping on the center of the edge of the Shape.

10. As illustrated in FIG. 16, in drawing and designing various elevations, opposite sides of the building can be both designed by and checked against each other by using the Mirror tool of MicroStation and snapping on the center of the edge of the Shape.

11. By referencing the Plan(s) File, MDP File and elevation Files together, one can work on any particular File while the others are referenced and know its exact relationship to all the other Files required for the contract documents. This geometric organization of all the Files with reference to the MDP File elements provides the possibility of a File being "moved" or changed accidentally. This organization suggests that in complicated and large projects, the reference MDP File and its coordination with existing conditions the levels may be protected by using Lock Levels in the Setting, Level, Manager of MicroStation. Only designated managers would have access to modify the MDP File.

II. Coordination of Sections and Details

The coordination of sections and details with elevations using the CAD coordination method of the invention will now be described again in connection with MicroStation, although those skilled in the art will appreciate that similar steps would be followed using AutoCAD or other well-known CAD software.

Figure 17:
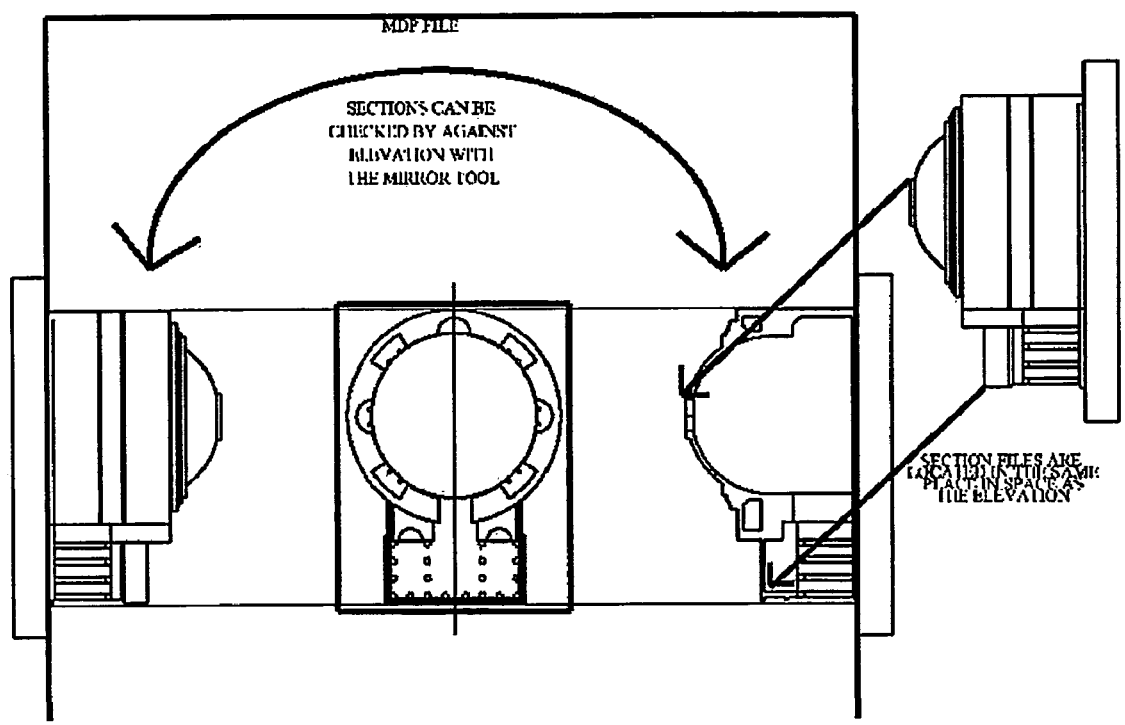
FIG. 17 illustrates that all sections and detail sections are designed and stored in separate Files that are referenced on and coordinated with the elevations and plans that have already been designed and spatially located.
Figure 18:
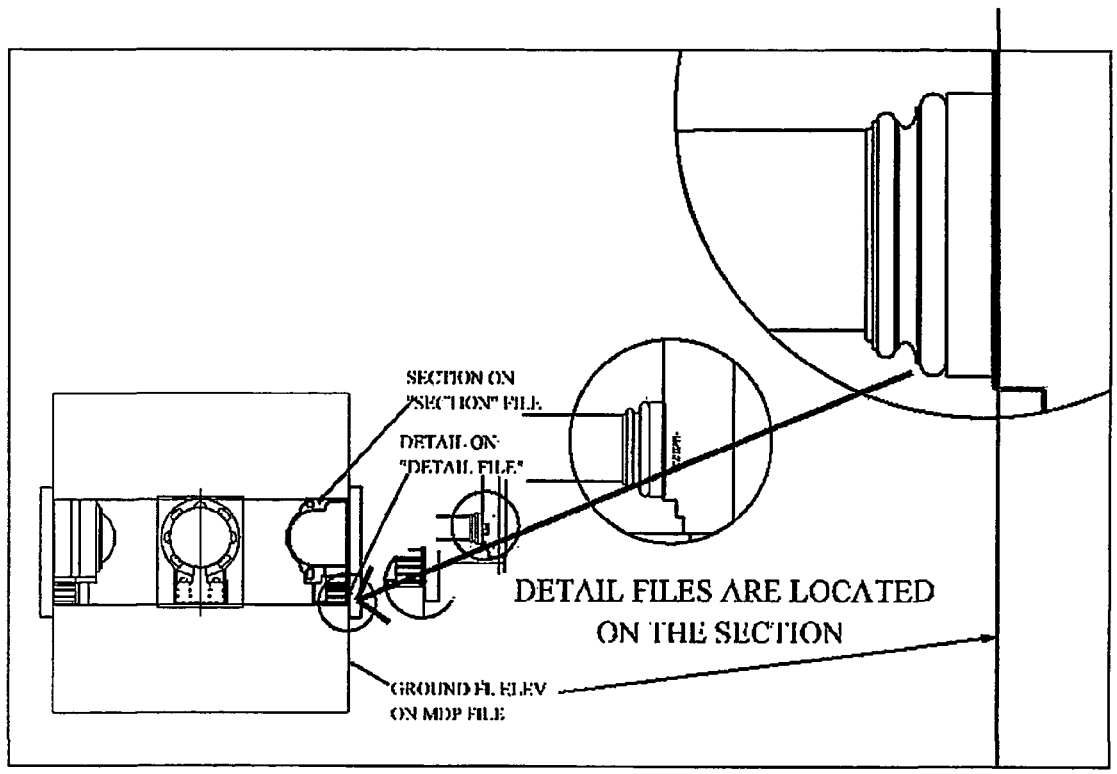
FIG. 18 illustrates how particular details are spatially located on the reference section "file."

1. As shown in FIG. 17, all sections and detail sections should be designed and stored in separate Files that are referenced on and coordinated with the elevations and plans that have already been designed and located as described above.
2. As shown in FIG. 18, particular details should also be located on the reference section "file." Because of the precision of the computer, this can go down in scale to the smallest possible detail. By placing the details in the proper referenced section location, all parts of the design maybe checked against each other. Wall sections may be developed at various points with its own "file" and checked for its coordination with all the other parts of the building-plans, sections, elevations, etc.

III. The Design and Location of Interior Elevations

The design and location of interior elevations using the CAD coordination method of the invention will now be described, again in connection with MicroStation CAD software, although those skilled in the art will appreciate that similar steps would be followed using AutoCAD or other well-known CAD software.

The process of designing interior elevations differs from exterior elevations since the walls seen from the interior are not projected down as with the exterior. The interior elevations are projected "out" from the edges of the room. Therefore, the logical location of each interior room elevation File is projected out from the edges of the referenced floor plan that they are to represent.

Figure 19:
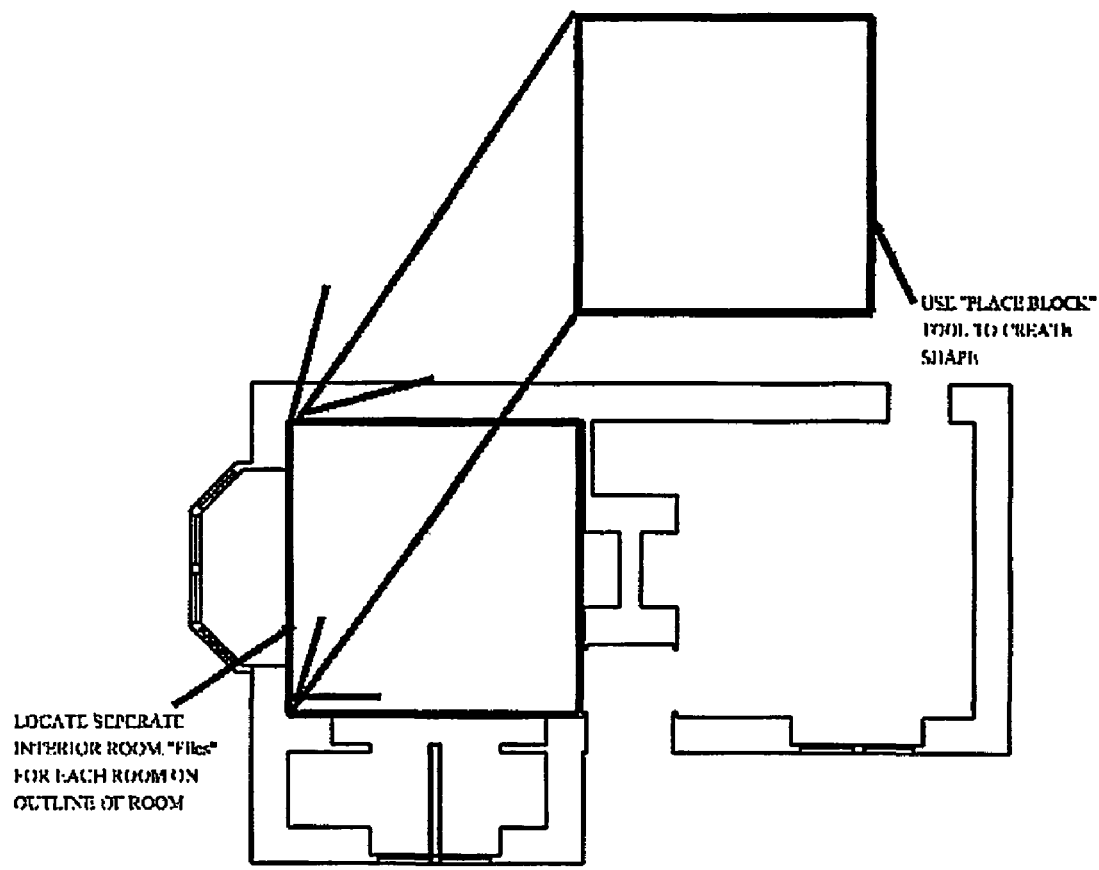
FIG. 19 illustrates that a separate File is created for each room or interior space that is to be represented.
Figure 20:
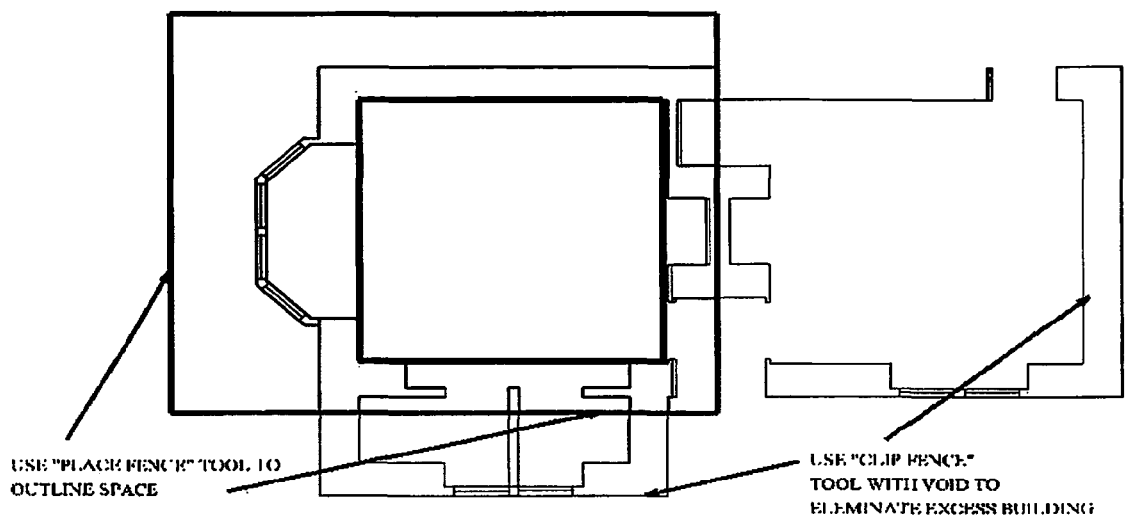
FIG. 20 illustrates that conventional CAD software routines may be used to remove all unnecessary parts of the Plan File.
Figure 21:
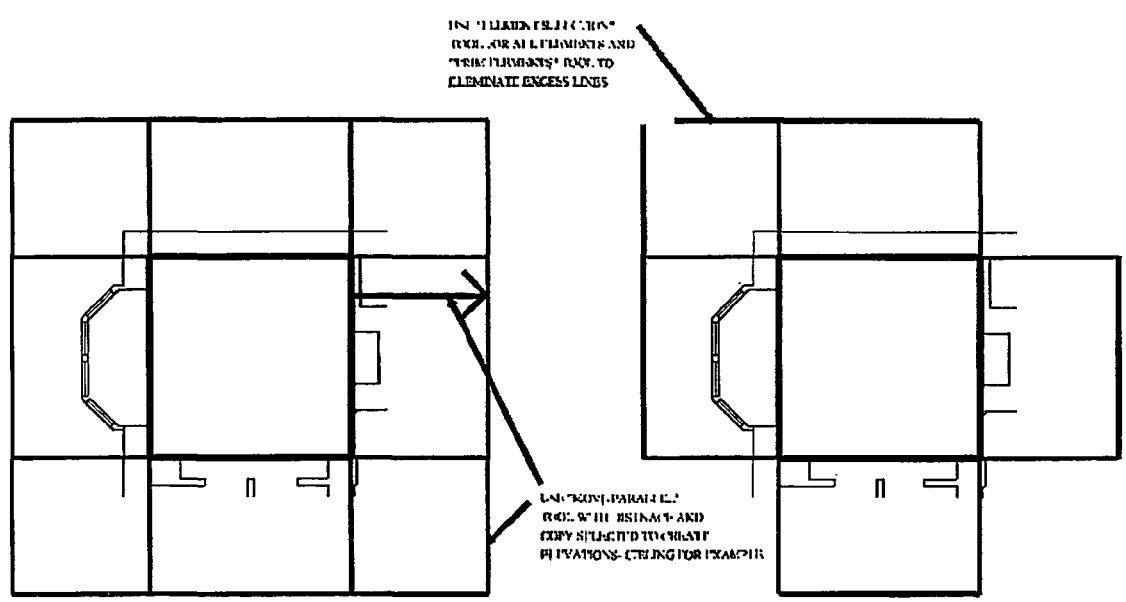
FIG. 21 illustrates the creation of all the horizontal z coordinate points with the unnecessary lines trimmed away.
Figure 22:
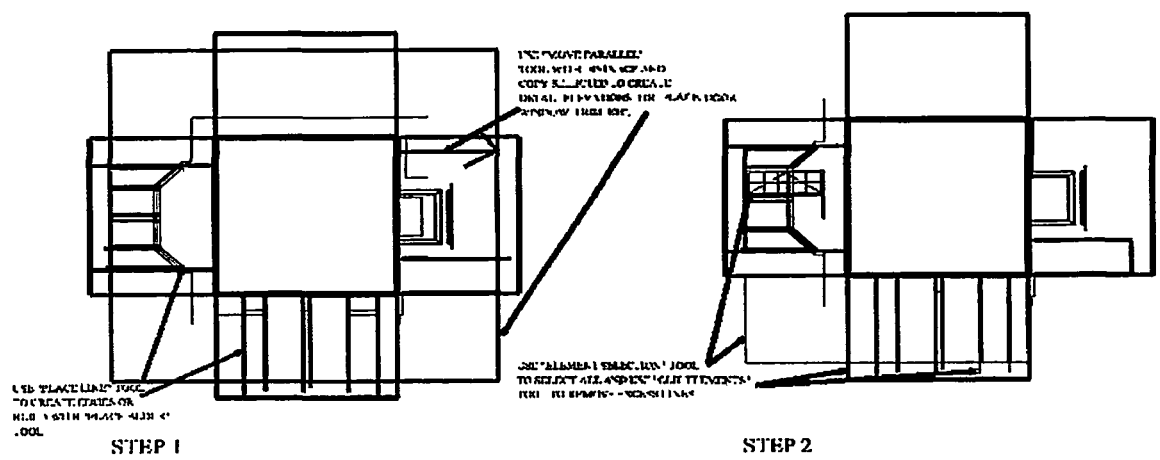
FIG. 22 illustrates the creation of necessary horizontal lines and the trimming away of unnecessary lines to create elevations.

1. As shown in FIG. 19, a separate File should be created for each room or interior space that is to be represented. On each particular room File, such as room 101 or living room, etc., the plan of the space to be represented should be attached as a referenced File. On top of the appropriate room or space on the referenced plan, use the Place Shape tool of MicroStation to create a Shape that has edges that are contiguous with the outer edges of the space or room. This Shape is similar to the Shape created on the original MDP except it outlines the individual room or interior space only.
2. As shown in FIG. 20, using the Place Fence tool of MicroStation, locate a fence which is identical to the Shape and use the delete Fence Contents tool of MicroStation and Fence Mode with Void-Clip to remove all unnecessary parts of the Plan File.
3. Again as in the creation of the exterior elevations, the Move Parallel tool of MicroStation is used to create all the horizontal z coordinate points. Similar to the drawing of the exterior elevations, the edges are drawn by using the PlaceLine tool of MicroStation to extend the edges of rooms and the Move Parallel tool is used with the established Shape to create the horizontal lines of the drawing. When these are determined, the Element Selection tool of MicroStation is used to select all elements and the Trim Element tool of MicroStation is used to trim away the unnecessary lines as shown in FIG. 21.
4. As shown in FIG. 22, continue using the Move Parallel tool from the original shape to create necessary horizontal lines and the Clip Element tool to trim away unnecessary lines to create elevations. Using Place Shape tools or its equivalent can also create parts.
5. Attaching the MDP, Plan, Section, etc. files and copying the appropriate interior elevations to the section and MDP file as necessary may verify the accuracy of the interior elevations. Any necessary adjustment to the elevations may be made and copied back to the working elevations for adjustment similar to exterior elevations described above.
6. Again, as in the exterior elevation design Files, opposite interior elevations may be created and checked against each other by using the Mirror tool snapping at the center of the perpendicular edge of the Shape.

The surfaces of the object may be extended as if they had been faltered in order to use the closed shapes or polygons. On the other hand, the horizontal levels can be illustrated as curved surfaces to show objects and buildings having curved surfaces that are curved in a single direction. Compound curved surfaces such as domes and parabolas pose the classic problems of global projections. For example, domes are often illustrated by ignoring the distortion as in the classic orthographic projection of a sphere.

The three-dimensional virtual reality model of the building or object should be located on the MDP file contiguous with the plan of the z-axis where the plans are located in space. As a file it can exist again "overlaid" on the MDP where the plan is located.

Those skilled in the art will appreciate that because the plan in the MDP can be located in the x and y-axis by its coordinates in longitude and latitudes, all buildings and structures in the world can be coordinated together based on their latitudes and longitudes. In addition, the z-axis is determined by sea level so that every point on every object in the world can be coordinated in the z-dimension as well. By having a systematic method for organizing the drawings of any building or object, all the information can be coordinated. Thus, cities and governments can request that all information be coordinated with this method of spatially organizing the location of CAD drawings. Then a city can have the same information for each building, road, utility, and the like systematically and spatially coordinated.

IV. Iconic File Switches

Figure 23:
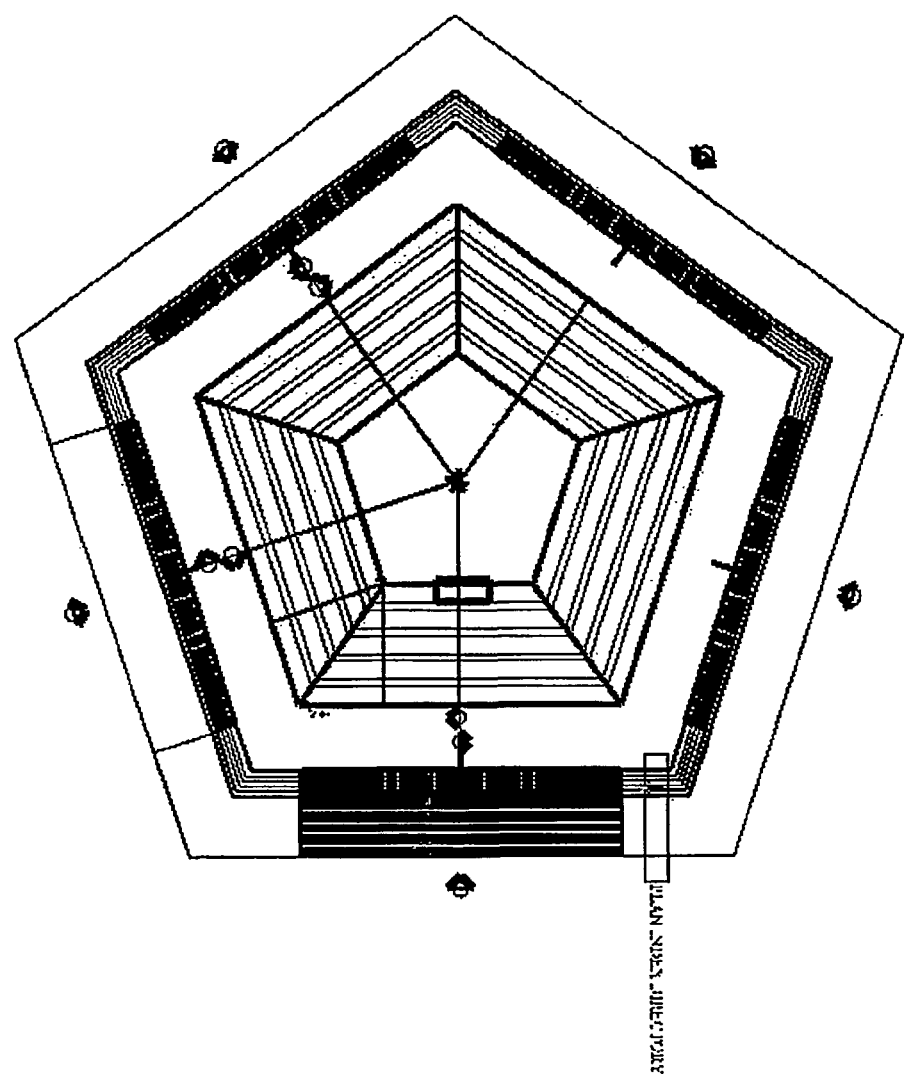
FIG. 23 illustrates how organizing CAD drawings in accordance with the method of the invention permits the plan, elevations, and Master Dimensional Plan (MDP) to be displayed at one time.
Figure 24:
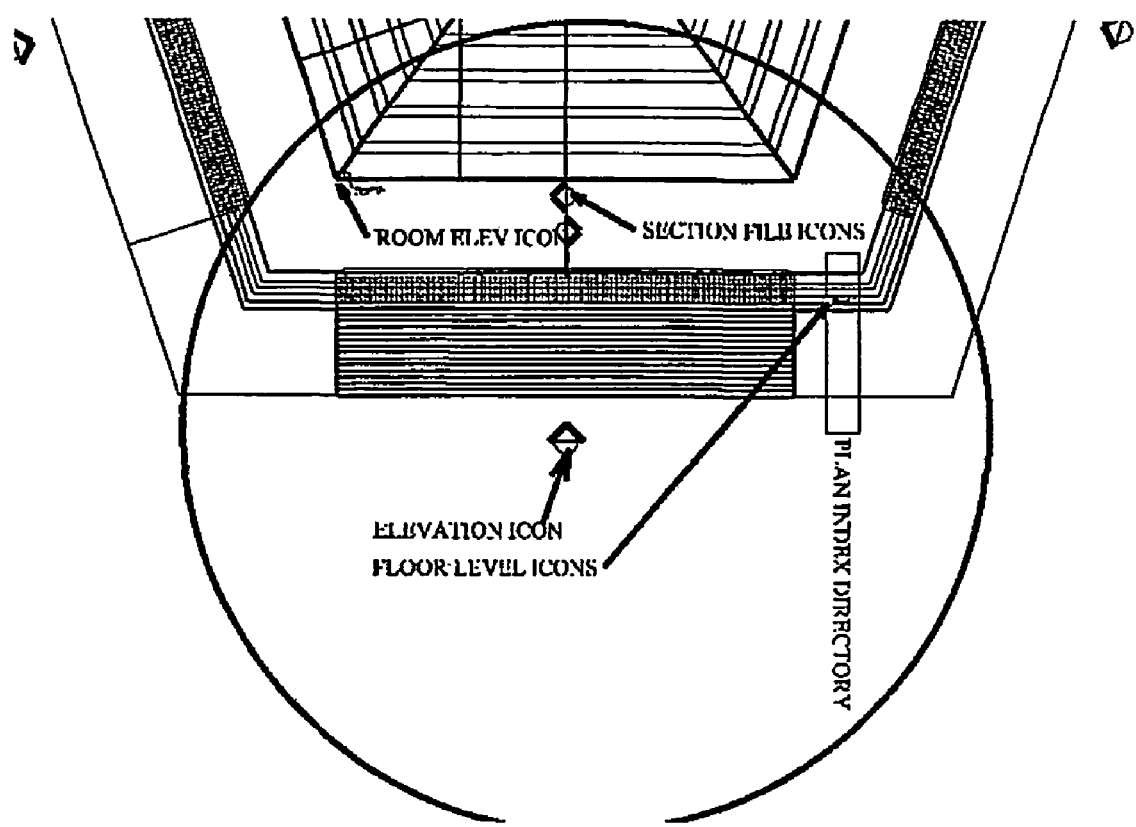
FIG. 24 illustrates a zoom view to one side of FIG. 23, showing that a "key" is provided on the elevation levels illustrated on the Master Dimensional Plan.

FIG. 23 illustrates how using the CAD Coordinator method of organizing CAD drawings described above permits the plan, elevations, and Master Dimensional Plan (MDP) to be displayed at one time. Within the framework of FIG. 23 (illustrating the Pentagon), sections, interior elevations, and structural, mechanical, and architectural details all can be displayed and coordinated graphically. As shown in FIG. 24, if one zooms to one side, a "key" is provided on the elevation levels illustrated on the Master Dimensional Plan. As will be explained below, on this key are placed a series of "switch file buttons" for enabling the file manipulation in accordance with the methods of the invention. When one clicks on one of these switch file buttons, the CAD software program presents the desired floor plan. A typical floor plan icon is illustrated in FIG. 25.

Figure 25:
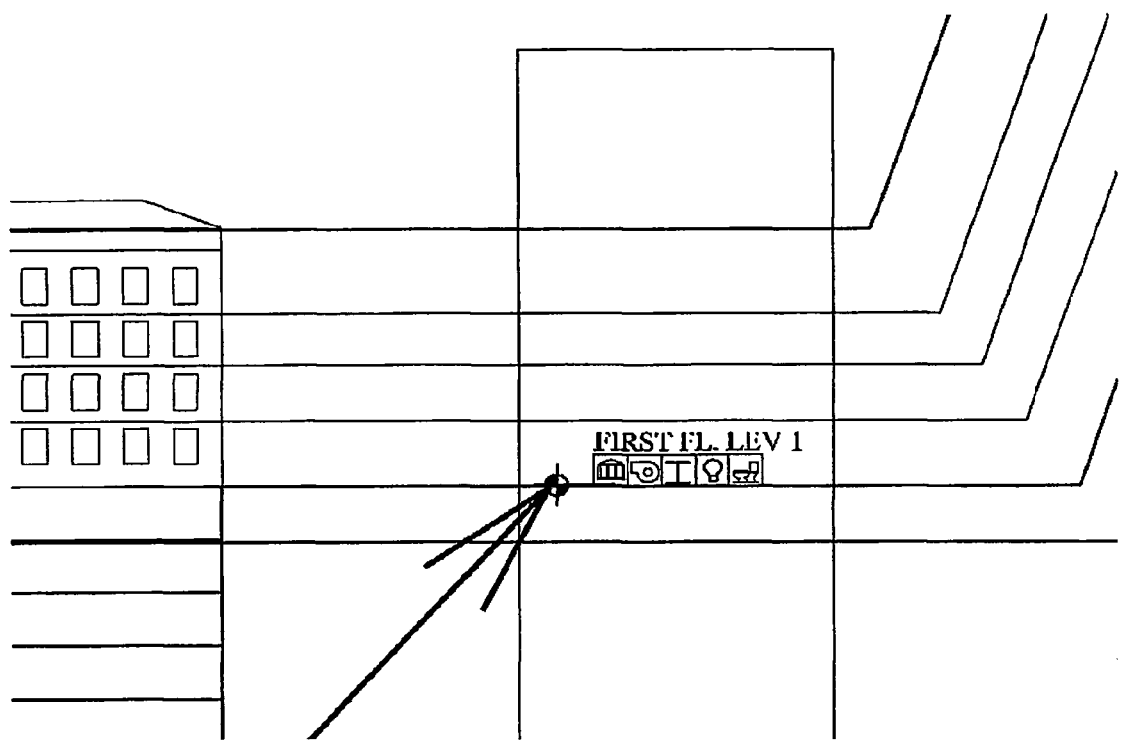
FIG. 25 illustrates a typical floor plan icon for use as a switch icon in accordance with the invention.

As also shown in FIG. 25, next to the level designation icon is a discipline icon (electrical, mechanical, plumbing, etc.) that allows the user to open any given floor plan file in the desired discipline. Note that for this illustration only one floor level has been shown for clarity. In reality, there would be a floor level switch shown for every level. For example, one can open the $1^{st}$ floor architecture plan or the $1^{st}$ floor electric plan, etc. Once one has switched to the desired floor plan, on that plan there can be a further series of "switch file icons" that take the user to a more detailed plan file or to other aspects of the building such as section, detail etc. Preferably, the switch file icons are based on information related to standard architectural graphic symbols such as section cuts, elevation symbol etc.

Figure 26:
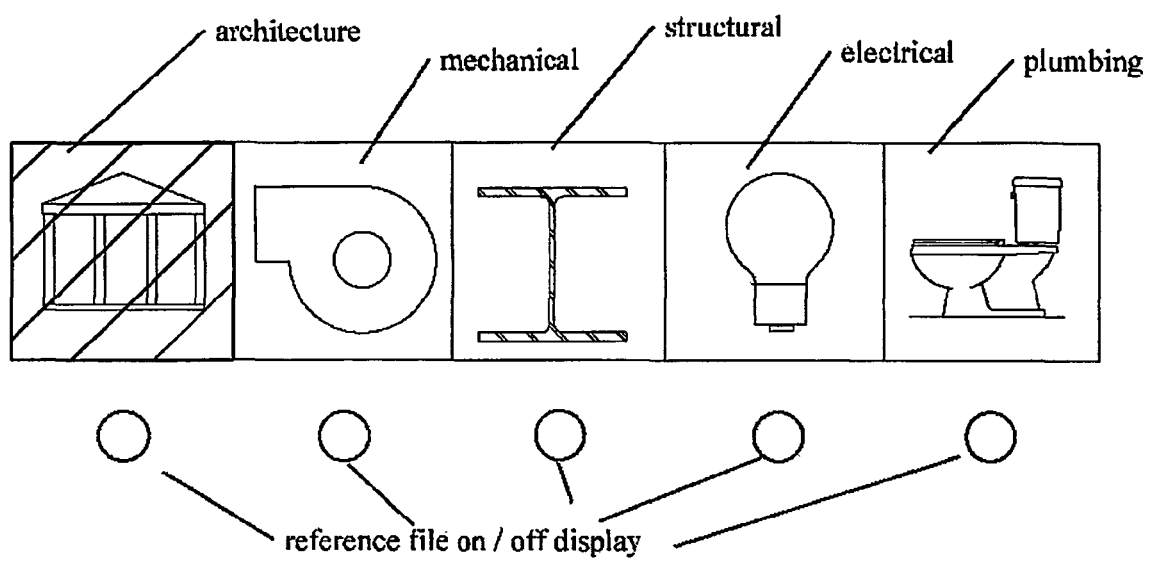
FIG. 26 illustrates a series of "switch discipline icons" that allow one to view different floor plans related to various disciplines such as structural, mechanical, electrical, or interior elevations.

As shown in FIG. 26, when the user is in the appropriate plan file, there can also be a series of "switch discipline icons" which allow one to view different floor plans related to various disciplines such as structural, mechanical, electrical, or interior elevations. As an example, when the plan of a room is being viewed, the user could click to the room symbol and turn on the interior wall level or reference file, depending on the filing organization, to view the interior elevations. Further, the reference file on/off display would be switches that turn on or off the destination file as a reference file as opposed to switching active files. This replaces the Reference file display sequence required when using a reference toolbox as in prior art CAD systems. This will allow quick reference to different layers of information to be displayed such as electrical, mechanical, structural, details, etc. with the plan to display the inter-relationships therewith.

As will be apparent to those skilled in the art, the method of the invention allows one to work and move through massive amounts of information held in innumerable design files and have a seamless way to relate them together with graphic icons for easy recall.

I. Creation of Iconic File Switches

A computer program for implementing the technique of the invention now will be described using the command features of the MicroStation Development Language of the well-known MicroStation CAD program. The macro program described herein combines a series of these steps into one function command. Those skilled in the art will appreciate that AutoCAD and other CAD programs also may be used to implement the same general organization principles in accordance with the invention. Those skilled in the art will also appreciate that the iconic switching technique of the invention is not limited to use with the spatial coordinating system described above but may be equally applicable to other organized CAD drawing systems.

A. General "Switch File Icons"

Figure 27:
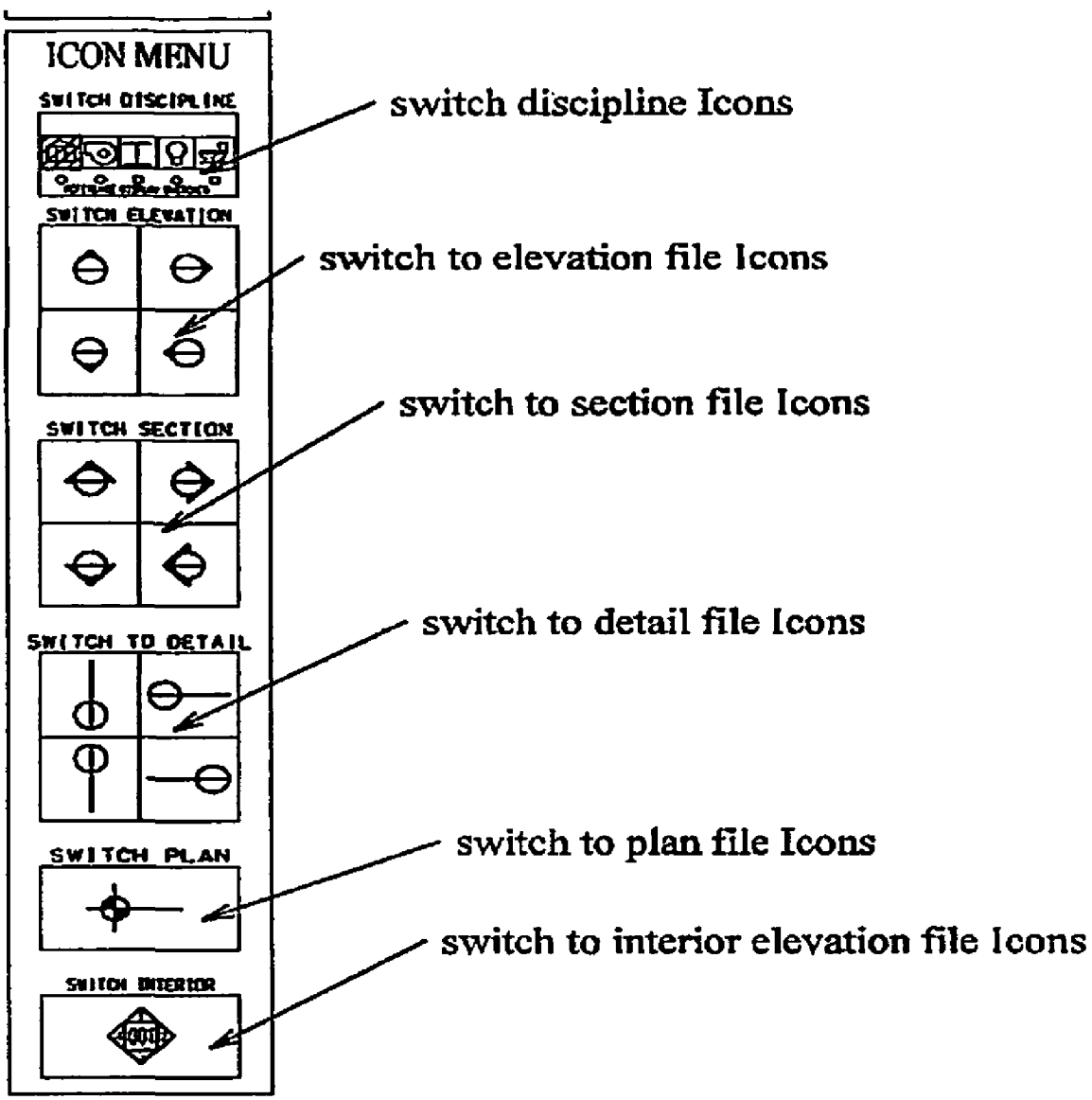
FIG. 27 illustrates conventional architectural iconic images.

Located upon a CAD file will be designated locations described herein as "switch file icons". These icons will have graphic images for ease of identification. The iconic images for architectural drawings are standard architectural drawing symbols such as section indicator, detail indicator, elevation view indicator, etc. as well as others as may be established by an individual or by national and international standards. Thus, the standard section cut arrows become the icon image for the "switch file icon." In accordance with the invention, clicking on this icon permits the user to move from a plan file to a section file. Obviously, the icon is not limited by a specific standard; however, as illustrated in FIG. 27, the usefulness of using culturally recognizable iconic images is obvious.

In use, the icon will "hover" when the cursor is over the icon. A left click of the mouse will select the icon and activate the macro of the switch file. Typically, the macro functions by opening the file corresponding to the icon selected by the cursor. On the other hand, if the cursor is over the hover button and the button is on, a right click of the mouse will bring up the proper toolbox for the selection of the "destination" file. The CAD software of the invention is thus programmed to move through the following sequence automatically: 1. Select file, 2. Open selected file, and 3. Will be programmed at the time of creation of a specific "icon" to switch to a predetermined destination file.

The predetermined destination file will be selected using a toolbox similar to the open file toolbox when the "switch button" is originally established. Once the destination file is established, it would be automatically selected without any illustrated toolboxes with a left click of the hover button. Should the destination file need to be changed, one may open the "switch file icon" toolbox with a right click of the hover button and change to the updated destination file.

Once the "switch file icon" is selected, the CAD program of the invention will activate a "macro program" which will switch from the present file and open the selected destination file. The icons themselves once established can be moved within or copied to the file space.

B. Switch Discipline Icon Group

Located upon a file (such as the MDP) can also be a "switch discipline icon group," a group of icons representing various discipline files. The purpose of this icon group is to allow the rapid switching between different discipline files related to each other in the same spatial location. As shown in FIG. 26, this group contains a set of icons representing different aspects of the architectural design, such as structure, electrical, mechanical, interior elevations, etc.

FIG. 26 illustrates the switch discipline file icon and the additional option of adding a reference display switch below for each discipline. Thus, if one wishes to have a reference file turned on for a specific discipline, one can turn on the circle button below each discipline to switch on or off given disciplines. Again, these buttons will be hover buttons which when activated will turn on or off the display of a reference file. This macro will be established in the same way as the switch file icons except it will be using the reference file tool box arrangement to establish the reference file which is turned on and off with the icon button. In this fashion, the CAD designer can move quickly back and forth to different disciplines of the design to coordinate and adjust various disciplines in various files, i.e., electrical files with architectural files with structural files, etc.

Thus, if the CAD designer were working in the plan file of a room, he or she would be able to click onto any element of the group file icon to move from that file to another related discipline file. For example, the CAD designer may be working in the architectural plan file. By selecting the "electric icon" switch, the CAD designer is automatically taken to the electrical file for the identical area The CAD designer could check the electrical against the architectural for coordination, make any necessary adjustments, and switch back to the architectural plan using the iconic switches.

C. Menu Portfolio of Architectural Graphic Symbol Switch File Icons

The invention preferably groups similar icons for quick insertion into CAD files in a menu of switch file icons. This menu can be either an add-on program to CAD drafting systems or integrated into the CAD program. The menu will group similar icons for quick insertion into the CAD files. Each group of icons is used to switch from one CAD file to another CAD file as set forth in FIG. 27, for example. The standard graphic architectural symbols of FIG. 27 are taken from the eighth edition of Architectural Graphic Standards and have historically been used as reference tags to indicate what page one should look to in order to find the specific information relating to different parts of the building. With the use of these symbols as icon switches in accordance with the invention, the CAD designer can move instantaneously to the information required, i.e., the desired CAD file that contains the information needed.

Figure 28:
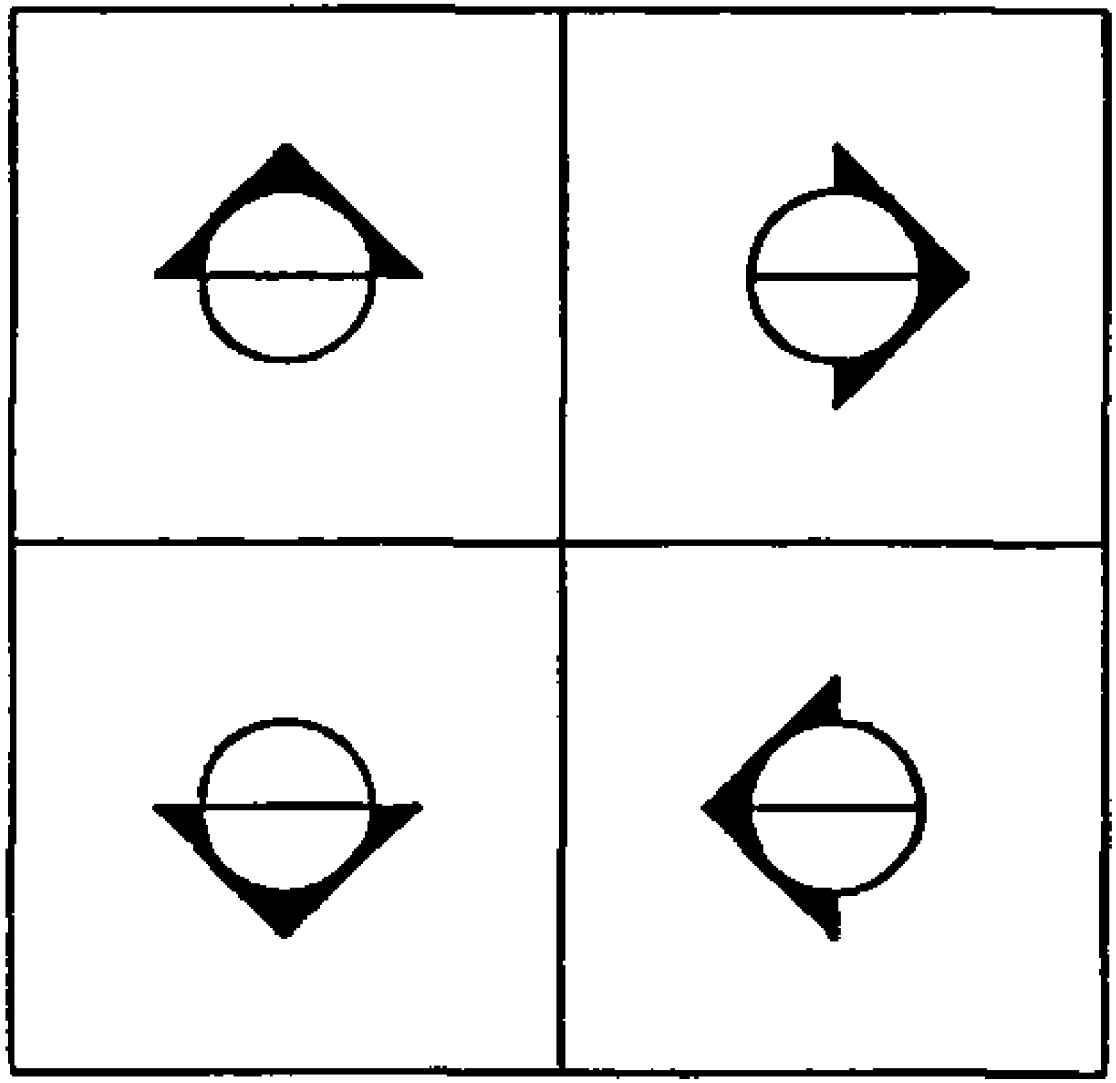
FIG. 28 illustrates four typical separate directional icons grouped by symbol type.

The menu itself contains groups of icons for each type of switch, each one usable for a different direction on the drawing for efficiency of selection without having to adjust the direction of the icon. FIG. 28 illustrates four typical separate directional icons grouped by symbol type. Each icon can be dragged onto the file and used as a switch as noted above.

VI. A "Set Up" Menu to Create a MDP CAD File

Figure 29:
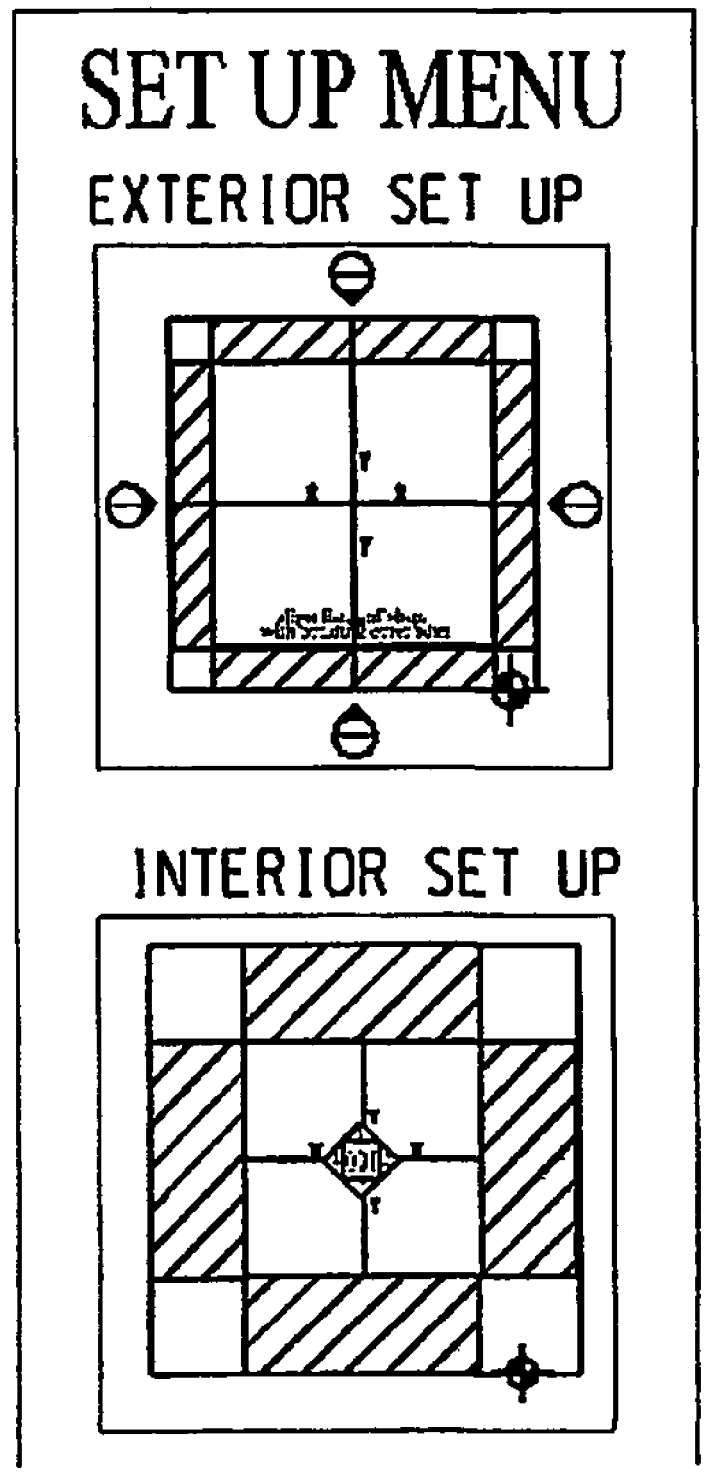
FIG. 29 illustrates the Master Dimensional Plan (MDP) creator icon in accordance with the invention.

In accordance with another aspect of the invention, the iconic graphic tools of the type described above may be used for placing CAD files in the proper spatial relationship based on the principles of the CAD coordination technique described above. As illustrated in FIG. 29, the first icon will be the Master Dimensional Plan (MDP) creator icon.

Figure 30:
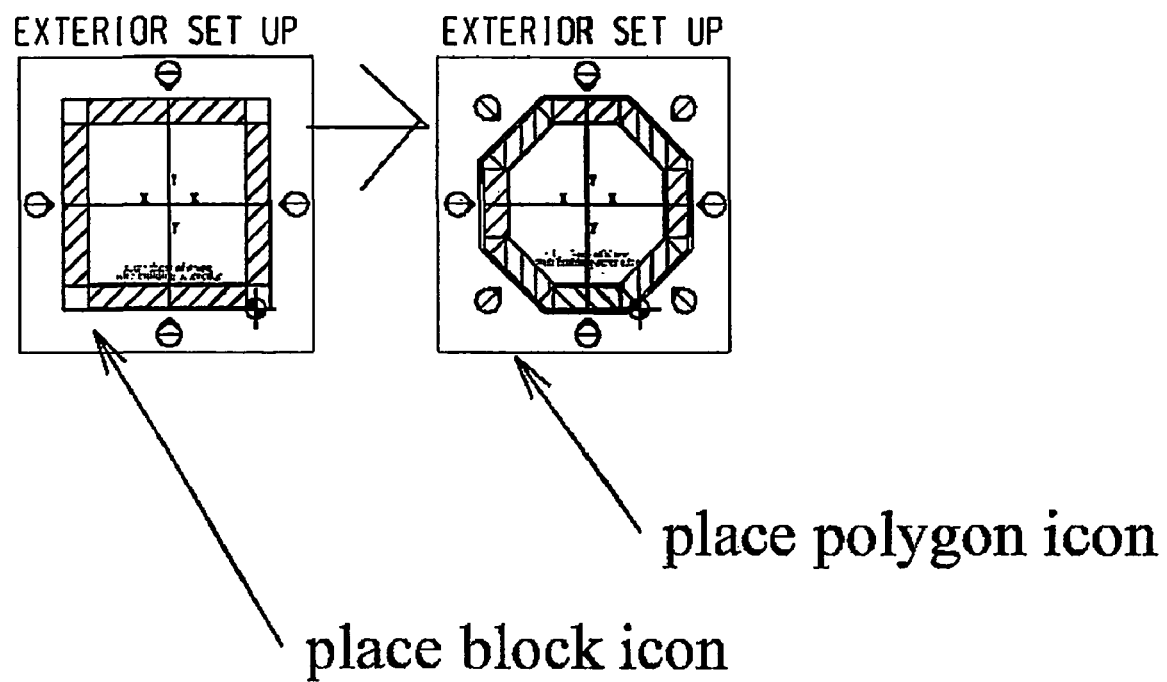
FIG. 30 illustrates different set up shapes imitating the "place block" toolbox, where the appropriate shape may be selected to fit the plan.

As shown in FIG. 29, the Set Up Icon Menu consists of two types of set up-exterior and interior. Both the exterior and the interior will have a series of different set up shapes imitating the "place block" toolbox. That is, they will contain various shapes such as block and polygon similar to the "place box" tools, and, as shown in FIG. 30, the appropriate shape will be selected to fit the plan. Because of the nature of projects which contain acute angles, a help dialog box may be used to describe the method for arranging the elevations relative to the plan in order to create a shape that will accept the "move parallel" command described above for setting the z elevations.

A. How the Exterior Set Up Works to Spatially Organize the CAD Files

Figure 31:
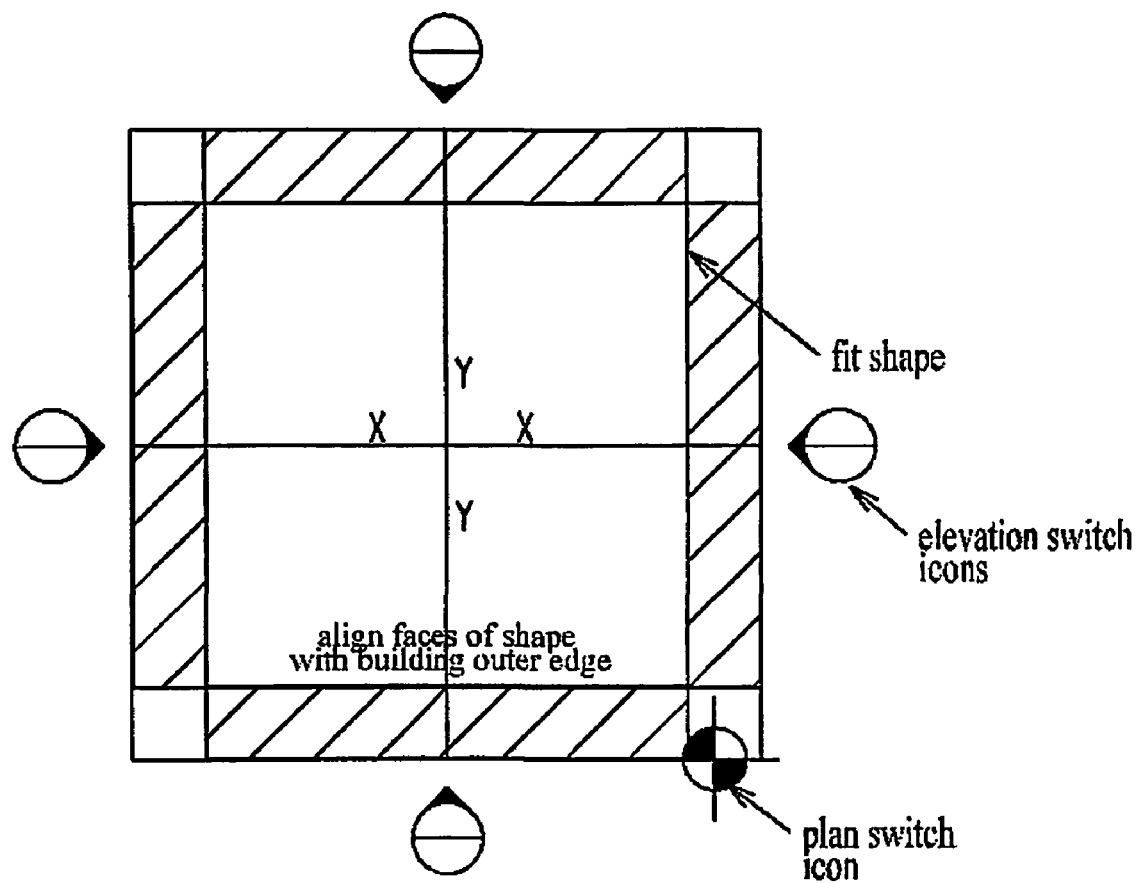
FIG. 31 illustrates a "seed MDP" file containing a series of switch file icons already attached, such as elevation, plan switch file icons as well as a shape to be fitted around the plan, and shapes for the exterior elevations.

When the "set up" icon is activated, it creates a dialog box and a series of "seed" files. The icon "seed" file is the MDP file described above and will have a cross hair indicating the x and y-axis, a shape to be fitted to the plan, and switch file icons for the elevations and plans. A dialog box appears with this first seed file. As illustrated in FIG. 31, the "seed MDP" file contains a series of switch file icons already attached, such as elevation, plan switch file icons as well as a shape to be fitted around the plan, and shapes for the exterior elevations. The dialog box will request that the following information be entered.

Since the icon assumes there is already a set of architectural CAD files for the project, the dialog box will request the selection of an existing floor plan file. This file will be attached as a reference file and displayed. Once the reference file has been selected, attached, and displayed in the dialog box, the computer operator will be instructed to move the x-y cross hair to the approximate x-y center of the attached plan file and to align the cross hair of the seed MDP file with the major x-y axis of the plan. When the operator completes this step, the dialog box will request the following information to establish the MDP "shape":

1. The dialog box will bring up the Place Block tool from which the operator will place the box on the MDP seed file.
2. Once the block has been placed, the dialog box will request the approximate height of the building.

When the approximate height has been established and entered, the CAD program modified in accordance with the invention will do the following:

First, the program will automatically create an offset parallel shape which is located a proportional distance from the first shape and a second shape which is a distance equal to the approximate height of the building. Second, the program will create a shape located on each of the sides of the offset shape the same width as the as the original shape. Third, centered below each of these shapes will be a "switch file" elevation icon.

The dialog box will request that the user name each elevation switch file icon. When the user has named the elevation switch file icon, the program will create a new seed file for each elevation as it is named. If the CAD drawing files of the elevations already exist, the program dialog box will request the following.

The dialog box for the switch file icon will appear requesting a designation of the destination file. When the destination file has been established, the dialog box will request that the CAD operator open the destination file, reference in the MDP and move the destination file to the proper spatial location relative to the MDP. For example, when the destination files of the existing CAD drawings of the elevation are displayed, this file will be moved to its proper location on the MDP file. The MDP file never moves once it is established on the existing plan files or with the new plan files. Instead, only the destination files are moved spatially to the Master Dimensional Plan (MDP) file. When all the elevations have been selected, and moved to their proper spatial location, the dialog box will request that any sections which exist be designated on the MDP file using the section switch file icons. When a section switch file icon is located on the MDP, the dialog box will request that the section destination file be selected. When it has been selected, the destination file will be opened and the dialog box will request that the destination file be moved to its proper spatial location (i.e., the section will be placed upon the elevation). The same procedure will be required of the detail files and their detail switch file icon. Thus, the procedure includes establishing the destination file, opening the destination file, and moving the destination file to the proper spatial location. Finally, any three dimensional files should be placed in the center as indicated above.

B. How the Interior Set Up Icon Works to Organize the CAD Files Spatially

Figure 32:
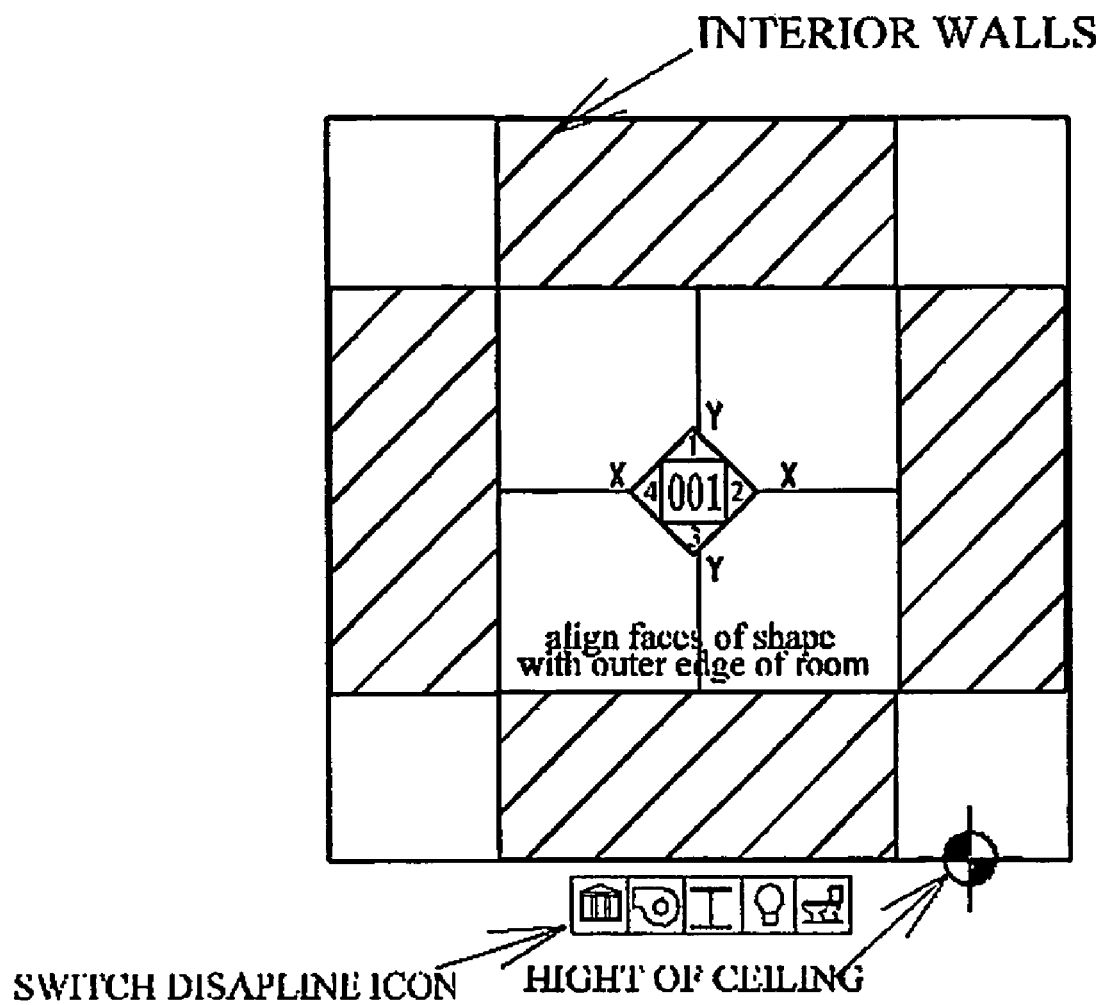
FIG. 32 illustrates how the interior set up icon works to organize the CAD files spatially in accordance with the invention.

The interior set up icon is similar to the exterior set up icon in that it contains a series of attached icons such as switch file and elevation icons. The location of interior elevation files will be created by first placing the interior elevation switch file icon on the MDP on each room. When the icon has been placed, the dialog box will follow the following procedure:

1 First the shape is determined by the shape of the room as shown in FIG. 32.
2 Second the height of the room is established.
3 Third the program will create the offset shape at the proper height of the room.
4 Fourth the program will establish the walls of each room as described above. If existing interior elevation files exist, they will be copied to the proper place on the MDP interior elevation seed file for each room. There will be a seed file for each room, which has a room number icon.
5 Finally, any three dimensional models will be moved to their proper location on the MDP file as indicated above.

VII. Zoom Icons

Zoom icons are area file designations that switch to a more specific area file such as moving from campus file to building file. Zoom icons are created with a simple key plan with a switch file icon for the proper CAD file. Thus, a key plan could be used to move from very large areas-campus groups, cities, states, etc. to a specific design file.

In extremely large buildings, such as the Pentagon or campus plans, a switch file icon for zooming to appropriate files would be appropriate. The zoom can be used globally by having a zoom icon on large maps such as the nation and then move down to state file, city file, district file, property file etc. Thus, corporations can move to see all the various files for all the projects they own globally. Of course, this feature permits the plan to be located globally in spatial coordinates so that all architectural files may be spatially related in global coordinates.

Although exemplary embodiments of the invention have been described in detail above, those skilled in the art will readily appreciate that many additional modifications are possible in the exemplary embodiment without materially departing from the novel teachings and advantages of the invention. For example, those skilled in the art will appreciate that other CAD programs may be used to implement the methodology of the invention. Moreover, those skilled in the art will appreciate that the spatial coordination technique and the use of switch icons to manipulate CAD files in accordance with the invention together provide the technical effect of providing an improved technique for spatially coordinating and manipulating CAD software files. However, those skilled in the art also will appreciate that these related techniques may be used independent of each other to useful effect. Those skilled in the art will also appreciate that the iconic switching technique of the invention may also be used to move among coordinated non-architectural design drawings of industrial items and the like. Accordingly, these and all such modifications are intended to be included within the scope of this invention as defined in the following claims.

I claim:

1. A method of spatially coordinating Computer Aided Design (CAD) files representing two-dimensional views of an object, comprising the steps of:
    creating a master dimensional plan file to which said CAD files are spatially located in two-dimensional working space as reference files;
    linking at least one of elevation, section, and detail files of said CAD files to said master plan file with the coordinates of said master dimensional plan file in said two-dimensional working space for display;
    linking concentric parallel shapes corresponding to respective z-axis coordinates of the object about an x-axis and y-axis representation of one z plan of said object so as to identify all points on all elevations intersecting the z-axis coordinate of the respective shape, whereby each concentric parallel shape defines a plane in the z-axis dimension for the object in said two-dimensional working space for display and allows for the illustration of the passage of said plane through all elevation, section, and detail files referenced to said master dimensional plan file including said z-axis dimension;
    linking each selected elevation, section, and detail of said CAD files to the corresponding x, y and z coordinate positions of said master dimensional plan file in two-dimensional working space; and
    displaying each said selected elevation, section, and detail files of said CAD files at the corresponding x, y, and z coordinate positions of said master dimensional plan in a display plane of said two-dimensional working space.

2. The method of claim 1, wherein said x, y, and z coordinate positions in two-dimensional working space correspond to latitude, longitude and height with respect to sea level in real world coordinates.

3. The method of claim 1, wherein each side of each concentric parallel shape is parallel to an elevation or an orthographic projection of an elevation of said object.

4. The method of claim 1, comprising the additional steps of moving amongst said linked CAD files by selecting switch file icons in CAD file views of said object, the switch file icons representing known architectural graphics symbols that are linked to the appropriate related CAD file based on the architectural graphics symbol of each switch file icon, and switching the displayed CAD file of the object upon selection of a corresponding switch file icon.

5. A method of moving amongst multiple Computer Aided Design (CAD) files representing different views of an object, comprising the steps of:
    adding switch file icons to CAD file views of the object, the switch file icons representing known architectural graphics symbols;
    linking the switch file icons to an appropriate related CAD file based on the architectural graphics symbol of each switch file icon; and
    switching the displayed CAD file view of the object upon selection of a corresponding switch file icon.

6. A Computer Aided Design (CAD) software program that creates and stores a plurality of CAD files representing two-dimensional views of an object and enables an operator to view said plurality of CAD files representing two-dimensional views of said object, said CAD software program further comprising:
    macro programs that open associated CAD files related to an object selected by the operator; and
    switch file icons selectable by the operator to initiate said macro programs to open associated CAD files to view CAD file two-dimensional views of the object, the switch file icons representing known architectural graphics symbols and being linked to the associated CAD files based on the architectural graphics symbol of each switch file icon,
    whereby the operator may switch the displayed CAD file two-dimensional view of the object upon selection of a corresponding switch file icon without knowledge of the name of the CAD file for the new CAD file view.

* * * * *